(12) United States Patent  
Yuan et al.

(10) Patent No.: US 11,769,445 B2  
(45) Date of Patent: Sep. 26, 2023

(54) MULTIPLEXER CIRCUIT, MULTIPLEXER, DRIVING METHOD, DISPLAY PANEL, AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Can Yuan, Beijing (CN); Yongqian Li, Beijing (CN); Zhidong Yuan, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/793,536

(22) PCT Filed: Sep. 2, 2021

(86) PCT No.: PCT/CN2021/116327  
§ 371 (c)(1),  
(2) Date: Jul. 18, 2022

(87) PCT Pub. No.: WO2022/083313  
PCT Pub. Date: Apr. 28, 2022

(65) Prior Publication Data  
US 2023/0079091 A1  Mar. 16, 2023

(30) Foreign Application Priority Data  
Oct. 21, 2020 (CN) .......................... 202011133273.5

(51) Int. Cl.  
*G09G 3/32* (2016.01)  
*G09G 3/3275* (2016.01)  
*H03K 17/693* (2006.01)

(52) U.S. Cl.  
CPC ............. *G09G 3/32* (2013.01); *G09G 3/3275* (2013.01); *H03K 17/693* (2013.01); *G09G 2310/0297* (2013.01); *G09G 2330/021* (2013.01)

(58) Field of Classification Search  
CPC ....................................................... G09G 3/32  
(Continued)

(56) References Cited

U.S. PATENT DOCUMENTS

2006/0071884 A1* 4/2006 Kim .................... G09G 3/3233  
345/76  
2010/0039453 A1  2/2010 Chaji et al.  
(Continued)

FOREIGN PATENT DOCUMENTS

CN  102165511 A  8/2011  
CN  105185326 A  12/2015  
(Continued)

OTHER PUBLICATIONS

The First Office Action for the Chinese Patent Application No. 202011133273.5 issued by the Chinese Patent Office dated Jun. 15, 2021.

(Continued)

*Primary Examiner* — Long D Pham  
(74) *Attorney, Agent, or Firm* — IP & T GROUP LLP

(57) ABSTRACT

A multiplexer circuit includes a first selection sub-circuit and a second selection sub-circuit. The first selection sub-circuit configured to transmit an input signal received at a input signal terminal to a first output terminal in response to a first control signal received at a first control terminal, and transmit a voltage of a power supply voltage terminal to the first output terminal in response to a second control signal received at a second control terminal. The second selection sub-circuit configured to transmit the input signal received at (Continued)

the input signal terminal to a second output terminal in response to a third control signal received at a third control terminal, and transmit the voltage of the power supply voltage terminal to the second output terminal in response to a fourth control signal received at a fourth control terminal.

18 Claims, 15 Drawing Sheets

(58) Field of Classification Search
 USPC .......................................................... 345/55
 See application file for complete search history.

(56) References Cited

U.S. PATENT DOCUMENTS

| | | |
|---|---|---|
| 2015/0379937 A1 | 12/2015 | Kim et al. |
| 2017/0221436 A1 | 8/2017 | Guo et al. |
| 2019/0005889 A1 | 1/2019 | Kwon et al. |
| 2020/0168163 A1 | 5/2020 | Kim et al. |
| 2020/0233522 A1 | 7/2020 | Gwon et al. |
| 2020/0294436 A1 | 9/2020 | Lai et al. |

FOREIGN PATENT DOCUMENTS

| | | |
|---|---|---|
| CN | 105761675 A | 7/2016 |
| CN | 109215584 A | 1/2019 |
| CN | 110706636 A | 1/2020 |
| CN | 110853556 A | 2/2020 |
| CN | 111243530 A | 6/2020 |
| CN | 112201198 A | 1/2021 |
| KR | 10-2017-0118341 A | 10/2017 |

OTHER PUBLICATIONS

The Second Office Action for the Chinese Patent Application No. 202011133273.5 issued by the Chinese Patent Office dated Dec. 29, 2021.

The Third Office Action for the Chinese Patent Application No. 202011133273.5 issued by the Chinese Patent Office dated May 16, 2022.

Decision of Rejection for the Chinese Patent Application No. 202011133273.5 issued by the Chinese Patent Office dated Sep. 26, 2022.

\* cited by examiner

MULTIPLEXER CIRCUIT, MULTIPLEXER, DRIVING METHOD, DISPLAY PANEL, AND DISPLAY APPARATUS

CROSS-REFERENCE TO RELATED APPLICATIONS

This application is a national phase entry under 35 USC 371 of International Patent Application No. PCT/CN2021/116327, filed on Sep. 2, 2021, which claims priority to Chinese Patent Application No. 202011133273.5, filed on Oct. 21, 2020, which are incorporated herein by reference in their entirety.

TECHNICAL FIELD

The present disclosure relates to the field of display technologies, and in particular, to multiplexer circuits, a multiplexer, driving methods, a display panel, and a display apparatus.

BACKGROUND

Self-luminous devices have been widely used in various terminal display products with high-resolution color screens due to their advantages such as high brightness, continuously adjustable emission color, low cost, fast response speed, low energy consumption, low driving voltage, wide operating temperature range, simple manufacturing process and high luminous efficiency.

SUMMARY

In an aspect, a multiplexer circuit is provided. The multiplexer circuit includes a first selection sub-circuit and a second selection sub-circuit. The first selection sub-circuit is coupled to a first control terminal, a second control terminal, an input signal terminal, a power supply voltage terminal and a first output terminal. The second selection sub-circuit is coupled to a third control terminal, a fourth control terminal, the input signal terminal, the power supply voltage terminal and a second output terminal. The first selection sub-circuit is configured to transmit an input signal received at the input signal terminal to the first output terminal in response to a first control signal received at the first control terminal, and transmit a voltage of the power supply voltage terminal to the first output terminal in response to a second control signal received at the second control terminal. The second selection sub-circuit is configured to transmit the input signal received at the input signal terminal to the second output terminal in response to a third control signal received at the third control terminal, and transmit the voltage of the power supply voltage terminal to the second output terminal in response to a fourth control signal received at the fourth control terminal.

In some embodiments, the first selection sub-circuit includes a first transistor and a second transistor. A control electrode of the first transistor is coupled to the first control terminal, a first electrode of the first transistor is coupled to the input signal terminal, and a second electrode of the first transistor is coupled to the first output terminal. A control electrode of the second transistor is coupled to the second control terminal, a first electrode of the second transistor is coupled to the power supply voltage terminal, and a second electrode of the second transistor is coupled to the first output terminal.

In some embodiments, the second selection sub-circuit includes a third transistor and a fourth transistor. A control electrode of the third transistor is coupled to the third control terminal, a first electrode of the third transistor is coupled to the input signal terminal, and a second electrode of the third transistor is coupled to the second output terminal. A control electrode of the fourth transistor is coupled to the fourth control terminal, a first electrode of the fourth transistor is coupled to the power supply voltage terminal, and a second electrode of the fourth transistor is coupled to the second output terminal.

In some embodiments, the multiplexer circuit further includes a first voltage control sub-circuit. The first voltage control sub-circuit is coupled to the power supply voltage terminal, the second control terminal and the first selection sub-circuit. The first voltage control sub-circuit is configured to control a voltage of the second control signal received by the first selection sub-circuit at the second control terminal according to the voltage of the power supply voltage terminal and the second control signal received at the second control terminal.

In some embodiments, the first voltage control sub-circuit includes a first capacitor. A first terminal of the first capacitor is coupled to the power supply voltage terminal, and a second terminal of the first capacitor is coupled to the second control terminal and the first selection sub-circuit.

In some embodiments, the multiplexer circuit further includes a second voltage control sub-circuit. The second voltage control sub-circuit is coupled to the power supply voltage terminal, the fourth control terminal and the second selection sub-circuit. The second voltage control sub-circuit is configured to control a voltage of the fourth control signal received by the second selection sub-circuit at the fourth control terminal according to the voltage of the power supply voltage terminal and the fourth control signal received at the fourth control terminal.

In some embodiments, the second voltage control sub-circuit includes a second capacitor. A first terminal of the second capacitor is coupled to the power supply voltage terminal, and a second terminal of the second capacitor is coupled to the fourth control terminal.

In another aspect, a multiplexer circuit is provided. The multiplexer circuit includes a first transistor, a second transistor, a third transistor and a fourth transistor. A control electrode of the first transistor is coupled to a first control terminal, a first electrode of the first transistor is coupled to an input signal terminal, and a second electrode of the first transistor is coupled to a first output terminal. A control electrode of the second transistor is coupled to a second control terminal, a first electrode of the second transistor is coupled to a power supply voltage terminal, and a second electrode of the second transistor is coupled to the first output terminal. A control electrode of the third transistor is coupled to a third control terminal, a first electrode of the third transistor is coupled to the input signal terminal, and a second electrode of the third transistor is coupled to a second output terminal. A fourth transistor, wherein a control electrode of the fourth transistor is coupled to a fourth control terminal, a first electrode of the fourth transistor is coupled to the power supply voltage terminal, and a second electrode of the fourth transistor is coupled to the second output terminal.

In yet another aspect, a multiplexer is provided. The multiplexer includes: a plurality of multiplexer circuits as described in any of the above embodiments. Input signal terminals of the plurality of multiplexer circuits are different, first output terminals of the plurality of multiplexer circuits are different, and second output terminals of the plurality of multiplexer circuits are different.

In some embodiments, the number of the multiplexer circuits is three.

In yet another aspect, a display panel is provided. The display panel includes a plurality of pixels and at least one multiplexer as described in any of the above embodiments. Each multiplexer is coupled to pixels in the plurality of pixels.

In some embodiments, the plurality of pixels are arranged in an array. The multiplexer is coupled to two columns of pixels. A first output terminal of each multiplexer circuit in the multiplexer is coupled to a column of pixels of the two columns of pixels, and a second output terminal of each multiplexer circuit in the multiplexer is coupled to another column of pixels of the two columns of pixels.

In some embodiments, the two columns of pixels coupled to the multiplexer are adjacent.

In some embodiments, each pixel includes a plurality of sub-pixels. A first output terminal and a second output terminal of each multiplexer circuit in each multiplexer are respectively coupled to sub-pixels that emit light of a same color in different pixels.

In some embodiments, the display panel further includes a plurality of sensing lines. The pixels coupled to the multiplexer are coupled to a sensing line.

In yet another aspect, a display apparatus is provided. The display apparatus includes the display panel described in any one of the above embodiments and a source driver. The source driver is coupled to the at least one multiplexer in the display panel.

In yet another aspect, a driving method of the multiplexer circuit according to any one of the above is provided. The driving method includes: transmitting, by the first selection sub-circuit, the input signal received at the input signal terminal to the first output terminal in response to the first control signal received at the first control terminal; transmitting, by the second selection sub-circuit, the voltage of the power supply voltage terminal to the second output terminal in response to the fourth control signal received at the fourth control terminal; transmitting, by the first selection sub-circuit, the voltage of the power supply voltage terminal to the first output terminal in response to the second control signal received at the second control terminal; and transmitting, by the second selection sub-circuit, the input signal received at the input signal terminal to the second output terminal in response to the third control signal received at the third control terminal.

In yet another aspect, a driving method of a multiplexer is provided. The multiplexer includes a plurality of multiplexer circuits. Each multiplexer circuit includes a first selection sub-circuit and a second selection sub-circuit. The first selection sub-circuit is coupled to a first control terminal, a second control terminal, an input signal terminal, a power supply voltage terminal and a first output terminal. The second selection sub-circuit is coupled to a third control terminal, a fourth control terminal, the input signal terminal, the power supply voltage terminal and a second output terminal. Input signal terminals of the plurality of multiplexer circuits are different, first output terminals of the plurality of multiplexer circuits are different, and second output terminals of the plurality of multiplexer circuits are different. The driving method includes: transmitting, by the first selection sub-circuit in each multiplexer circuit, an input signal received at the input signal terminal coupled to the first selection sub-circuit in each multiplexer circuit to the first output terminal coupled to the first selection sub-circuit in each multiplexer circuit in response to a first control signal received at the first control terminal; transmitting, by the second selection sub-circuit in each multiplexer circuit, a voltage of the power supply voltage terminal to the second output terminal coupled to the second selection sub-circuit in each multiplexer circuit in response to a fourth control signal received at the fourth control terminal; transmitting, by the first selection sub-circuit in each multiplexer circuit, the voltage of the power supply voltage terminal to the first output terminal coupled to the first selection sub-circuit in each multiplexer circuit in response to a second control signal received at the second control terminal; and transmitting, by the second selection sub-circuit in each multiplexer circuit, the input signal received at the input signal terminal coupled to the second selection sub-circuit in each multiplexer circuit to the second output terminal in response to a third control signal received at the third control terminal.

In yet another aspect, a driving method of the display apparatus according to any one of the above is provided. Each pixel in the display panel in the display apparatus includes a plurality of sub-pixels. Each sub-pixel includes a pixel circuit. The pixel circuit includes a driving transistor. The display panel further includes a plurality of sensing lines. The pixels coupled to the multiplexer in the display panel are coupled to a sensing line. The driving method includes: providing, by the source driver, input signals to all multiplexer circuits in the multiplexer in the display panel; transmitting, by a first selection sub-circuit in a multiplexer circuit in the multiplexer, an input signal received at an input signal terminal coupled to the first selection sub-circuit in the multiplexer circuit in the multiplexer to a first output terminal coupled to the first selection sub-circuit in the multiplexer circuit in the multiplexer in response to the first control signal received at the first control terminal; transmitting, by a second selection sub-circuit in the multiplexer circuit in the multiplexer, the voltage of the power supply voltage terminal to a second output terminal coupled to the second selection sub-circuit in the multiplexer circuit in the multiplexer in response to the fourth control signal received at the fourth control terminal; sensing, by the sensing line, a threshold voltage of a driving transistor of a pixel circuit in a sub-pixel in a pixel coupled to the first output terminal; transmitting, by the first selection sub-circuit in the multiplexer circuit in the multiplexer, the voltage of the power supply voltage terminal to the first output terminal coupled to the first selection sub-circuit in the multiplexer circuit in the multiplexer in response to the second control signal received at the second control terminal; transmitting, by the second selection sub-circuit in the multiplexer circuit in the multiplexer, the input signal received at the input signal terminal coupled to the second selection sub-circuit in the multiplexer circuit in the multiplexer to the second output terminal coupled to the second selection sub-circuit in the multiplexer circuit in the multiplexer in response to the third control signal received at the third control terminal; and sensing, by the sensing line, a threshold voltage of a driving transistor of a pixel circuit in a sub-pixel in a pixel coupled to the second output terminal.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, actual processes of methods, and actual timings of signals involved in the embodiments of the present disclosure.

DETAILED DESCRIPTION

Figure 1:
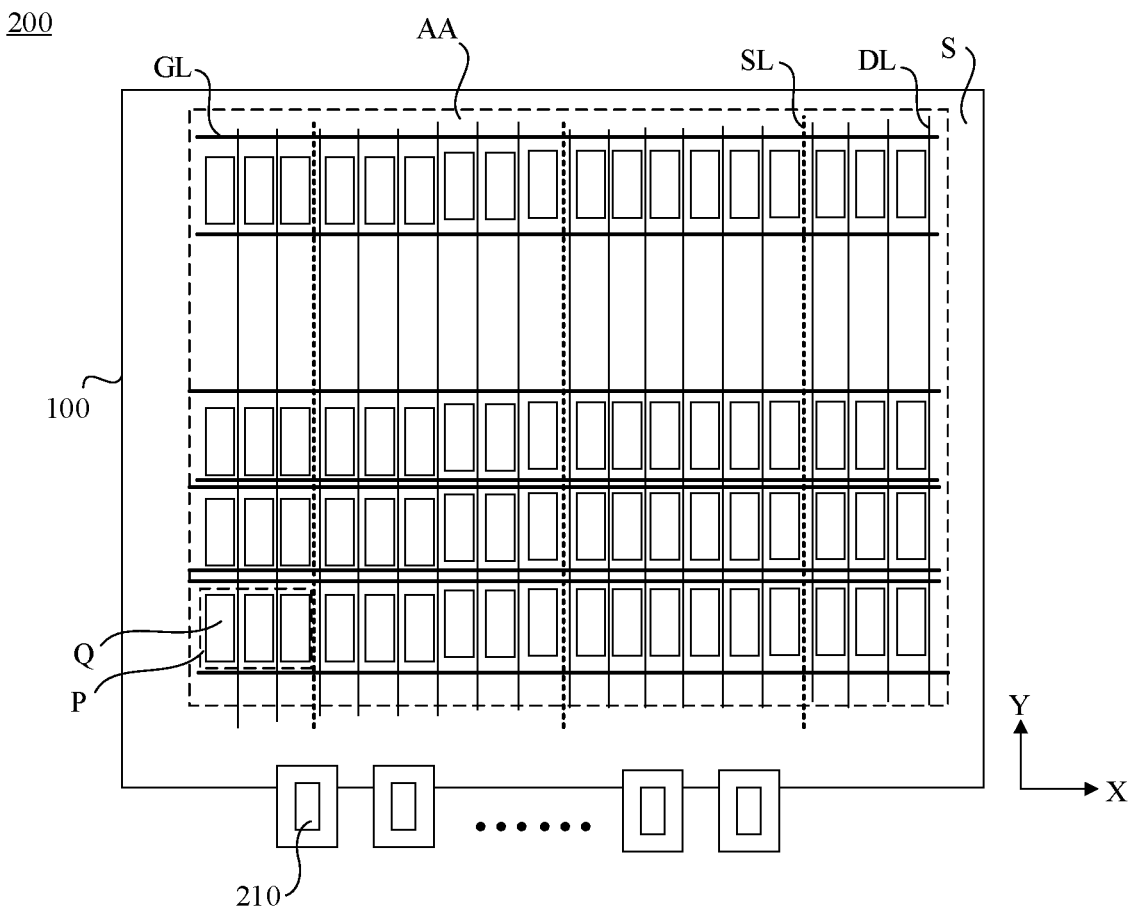
FIG. 1 is a structural diagram of a display apparatus, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in open and inclusive meaning, i.e., "including, but not limited to". In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representation of the above term does not necessarily refer to the same embodiment(s) or examples(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "multiple," "a plurality of" or "the plurality of" means two or more unless otherwise specified.

In the description of some embodiments, the terms "coupled" and "connected" and derivatives thereof may be used. For example, the term "connected" may be used when describing some embodiments to indicate that two or more components are in direct physical or electrical contact with each other. For another example, the term "coupled" may be used when describing some embodiments to indicate that two or more components have direct physical or electrical contact. However, the term "coupled" or "communicatively coupled" may also mean that two or more components are not in direct contact with each other, but still cooperate or interact with each other. The embodiments disclosed herein are not necessarily limited to the content herein.

As used herein, the term "if", depending on the context, is optionally construed as "when" or "in a case where" or "in response to determining that" or "in response to detecting". Similarly, depending on the context, the phrase "if it is determined" or "if [a stated condition or event] is detected" is optionally construed as "in a case where it is determined" or "in response to determining" or "in a case where [the stated condition or event] is detected" or "in response to detecting [the stated condition or event]".

The use of the phrase "applicable to" or "configured to" herein means an open and inclusive expression, which does not exclude devices that are applicable to or configured to perform additional tasks or steps.

The term such as "about" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Some embodiments of the present disclosure provide a display apparatus. For example, the display apparatus may be any apparatus that displays images whether in motion (such as videos) or stationary (such as static images), and whether literal or graphical. More specifically, the display apparatus may be one of a variety of electronic apparatuses, and the embodiments may be implemented in or associated with a variety of electronic apparatuses. The variety of electronic apparatuses include (but not limited to) mobile phones, wireless apparatuses, personal data assistants (PDAs), hand-held or portable computers, GPS receivers/navigators, cameras, MP4 video players, video cameras, game consoles, watches, clocks, calculators, television monitors, flat panel displays, computer monitors, auto displays (e.g., odometer displays), navigators, cockpit controllers and/or displays, camera view displays (e.g., rear view camera displays in vehicles), electronic photos, electronic billboards or signs, projectors, building structures, packaging structures, and aesthetic structures (e.g., displays for an image of a piece of jewelry). The embodiments of the present disclosure do not particularly limit a specific form of the display apparatus.

In some embodiments, as shown in FIG. 1, the display apparatus 200 includes a display panel 100. The display panel 100 has a display area AA and a peripheral area S. The peripheral area S is located on at least one side of the display area AA.

The display panel 100 includes a plurality of pixels P disposed in the display area AA. For example, the plurality of pixels P may be arranged in an array. For example, sub-pixels P arranged in a line in a direction X in FIG. 1 are referred to as sub-pixels in a same row, and sub-pixels P arranged in a line in a direction Y in FIG. 1 are referred to as sub-pixels in a same column.

In some embodiments, as shown in FIG. 1, each pixel P includes a plurality of sub-pixels Q. For example, the plurality of sub-pixels include a sub-pixel of a first color, a sub-pixel of a second color and a sub-pixel of a third color. For example, the first color, the second color, and the third color are three primary colors. For example, the first color, the second color, and the third color are red, green, and blue, respectively. That is, the plurality of sub-pixels include a red sub-pixel, a green sub-pixel, and a blue sub-pixel.

Figure 2:
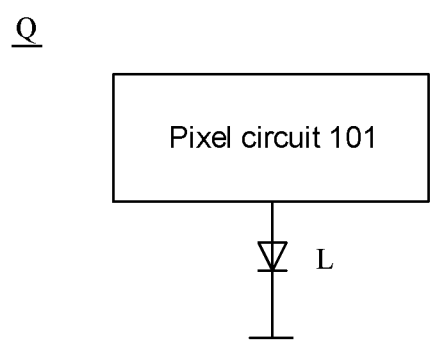
FIG. 2 is a schematic diagram of a sub-pixel, in accordance with some embodiments

As shown in FIG. 2, each sub-pixel Q includes a pixel circuit 101 and a light-emitting device L. The pixel circuit 101 is coupled to the light-emitting device L.

For example, the light-emitting device L may be an organic light-emitting diode (OLED) or a light-emitting diode (LED). In this case, a working duration described herein may be understood as a light-emitting duration of the light-emitting device L. A first electrode and a second electrode of the light-emitting device L are an anode and a cathode of the light-emitting diode.

It will be noted that, the embodiments of the present disclosure do not limit a specific structure of the pixel circuit, which may be designed according to actual situations. For example, the pixel circuit is composed of electronic devices such as a thin film transistors (TFT) and a capacitor (C). For example, the pixel circuit may include two thin film transistors (a switching transistor and a driving transistor) and a capacitor to form a 2T1C structure. Of course, the pixel circuit may also include more than two thin film transistors (multiple switching transistors and a driving transistor) and at least one capacitor. For example, referring to FIG. 3, the pixel circuit may include a capacitor and three transistors (two switching transistors and a driving transistor) to form a 3T1C structure.

In some embodiments, as shown in FIG. 1, the display panel 100 further includes a plurality of gate lines GL and a plurality of data lines DL. For example, the plurality of gate lines GL extend along a direction X in FIG. 1, and the plurality of data lines DL extend along a direction Y in FIG. 1. The gate lines GL are configured to transmit scan signals, and the data lines DL are configured to transmit data signals. For example, each pixel circuit 101 is coupled to at least one gate line GL and one data line DL, and the gate line(s) GL and the data line DL provide the pixel circuit 101 with working signals, so that the pixel circuit 101 drives the light-emitting device L to emit light. For example, pixel circuits in each row are coupled to two gate lines, one gate line transmits a first scan signal (G1) to the pixel circuits, and the other gate line transmits a second scan signal (G2) to the pixel circuits.

In some embodiments, as shown in FIG. 1, the display panel 100 further includes a plurality of sensing lines SL. For example, the plurality of sensing lines SL extend along the direction Y in FIG. 1. The pixel circuit 101 is coupled to a sensing line SL.

Figure 3:
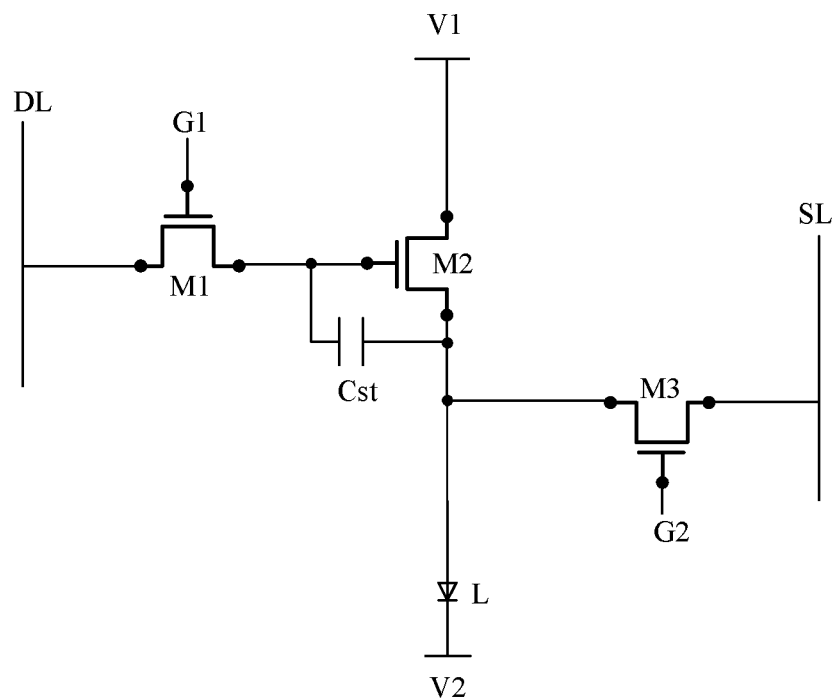
FIG. 3 is a circuit diagram of a pixel circuit, in accordance with some embodiments.

For example, as shown in FIG. 3, a control electrode (gate) of a switching transistor M1 is used for receiving a first scan signal G1. A first electrode of the switching transistor M1 is coupled to a data line DL, so as to receive a data signal Vdata transmitted on the data line DL. A second electrode of the switching transistor M1 is coupled to a control electrode of a driving transistor M2, a second electrode of the driving transistor M2 is coupled to a first voltage terminal V1 to receive a first voltage (a high voltage), and a first electrode (source) of the driving transistor M2 is coupled to a first electrode of a light-emitting device L, and a second electrode of the light-emitting device L is coupled to a second voltage terminal V2. A first terminal of a storage capacitor Cst is coupled to the second electrode of the switching transistor M1 and the control electrode of the driving transistor M2, and a second terminal of the storage capacitor Cst is coupled to the first electrode of the driving transistor M2 and the first electrode of the light-emitting device L. A control electrode of a sensing transistor M3 (i.e., another switching transistor) is used for receiving a second scan signal G2. A first electrode of the sensing transistor M3 is coupled to the second terminal of the storage capacitor Cst, the first electrode of the driving transistor M2 and the first electrode of the light-emitting device L, and a second electrode of the sensing transistor M3 is coupled to a sensing line SL. The sensing line SL is coupled to a detection circuit (which is not shown in the figures). In a case where the driving transistor M2 is turned on, the driving transistor M2 discharges the sensing line through the sensing transistor M3, so that a voltage of the first electrode of the driving transistor M2 changes.

Thus, after the driving transistor M2 is turned on, the driving transistor M2 discharges the detection circuit through the sensing transistor M3 or charges a capacitor or a parasitic capacitor provided on the sensing line through the sensing transistor M3, so that a source voltage of the driving transistor M2 changes. In a case where the source voltage of the driving transistor M2 is equal to a difference between a gate voltage and a threshold voltage Vth of the driving transistor M2, the driving transistor M2 will be turned off and the source voltage of the driving transistor M2 will not change. In this case, after the driving transistor M2 is turned off, through the turned-on sensing transistor M3, a turned-off source voltage of the source of the driving transistor M2 (i.e., the source voltage Vb of the turned-off driving transistor M2) may be obtained. In a case where the turned-off source voltage Vb is obtained, the threshold voltage of the driving transistor M2 may be obtained (i.e., Vth=Vdata−Vb). Therefore, it is possible to compensate a data signal (e.g., a data voltage) to be displayed of each pixel circuit based on the threshold voltage of the driving transistor in the pixel circuit, and to drive the pixel circuit with the compensated data signal. As a result, the compensation function for the threshold voltage of each sub-pixel of the display panel may be realized. For example, the compensated data signal Vdata_C may be represented as the following expression: Vdata_C=Vdata+Vth.

For example, a single sensing line is coupled to multiple pixel circuits. For example, pixel circuits in adjacent two columns of pixels may be coupled to a single sensing line. In a case where each pixel includes three sub-pixels, for a row of pixels, a single sensing line may be coupled to pixel circuits in six sub-pixels in adjacent two columns of pixels, so as to detect the threshold voltage of the driving transistor in each pixel circuit.

In some embodiments, as shown in FIG. 1, the display apparatus 200 further includes source driver(s) (i.e., source driver integrated circuit(s) (Source IC(s))) 210. The source driver(s) 210 are bonded to the display panel 100, and the source driver(s) 210 are configured to provide signals to the display panel 100. For example, the signals may be data signals. For example, the plurality of data lines DL in the display panel 100 may transmit the data signals. For example, referring to FIG. 1, the source driver 210 may adopt a chip on film (COF) process. That is, the source driver 210 is provided on a flexible printed circuit board (FPC), and is bonded to the display panel 100 through the FPC.

In the high resolution display apparatus, the number of pixel circuits in the display panel is large, and the number of signal lines (e.g., the gate lines and the data lines) that provide working signals for the pixel circuits in the display panel is also large, so that the number of pins or output terminals required by the driver(s) (e.g., the source driver(s) that provide the data signals for the data lines) coupled to the signal lines may also be large. For example, output terminals of the source driver are coupled to data lines in one-to-one correspondence, so that the number of the output terminals of the source driver is increased. In this way, the production cost and the occupied area are increased, and a layout space in a bonding area of the display panel is limited. As a result, the yield of products is easily reduced.

Figure 4:
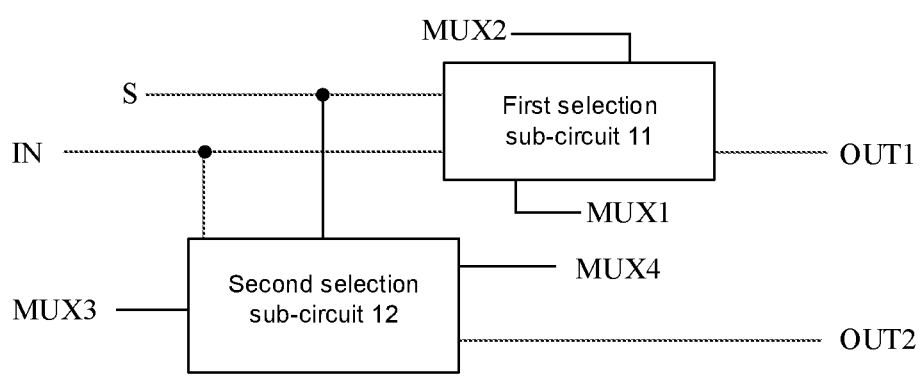
FIG. 4 is a schematic diagram of a multiplexer circuit, in accordance with some embodiments.

Embodiments of the present disclosure provide a multiplexer circuit 10. As shown in FIG. 4, the multiplexer circuit 10 includes a first selection sub-circuit 11 and a second selection sub-circuit 12.

The first selection sub-circuit 11 is coupled to a first control terminal MUX1, a second control terminal MUX2, an input signal terminal IN, a power supply voltage terminal S and a first output terminal OUT1. The second selection sub-circuit 12 is coupled to a third control terminal MUX3, a fourth control terminal MUX4, the input signal terminal IN, the power supply voltage terminal S and a second output terminal OUT2.

The first selection sub-circuit 11 is configured to transmit an input signal received at the input signal terminal IN to the first output terminal OUT1 in response to a first control signal received at the first control terminal MUX1, and transmit a voltage of the power supply voltage terminal S to the first output terminal OUT1 in response to a second control signal received at the second control terminal MUX2.

The second selection sub-circuit 12 is configured to transmit the input signal received at the input signal terminal IN to the second output terminal OUT2 in response to a third control signal received at the third control terminal MUX3, and transmit the voltage of the power supply voltage terminal S to the second output terminal OUT2 in response to a fourth control signal received at the four control terminals MUX4.

Figure 5:
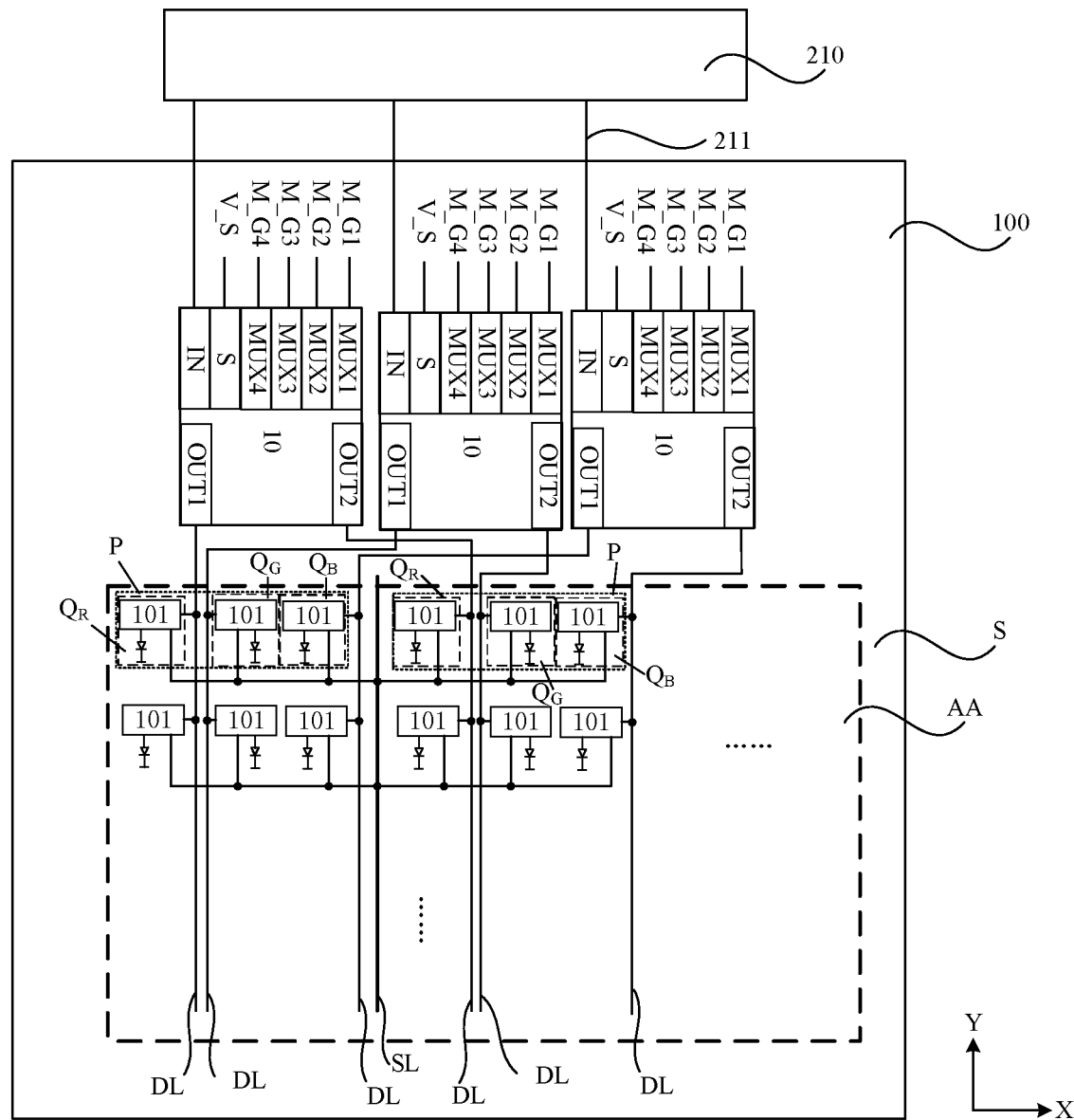
FIG. 5 is a schematic diagram of a display apparatus, in accordance with some embodiments.

It will be understood that, as shown in FIG. 5, the display panel 100 further includes first control signal lines M_G1, second control signal lines M_G2, third control signal lines M_G3, fourth control signal lines M_G4 and power supply voltage lines V_S. The first control terminal MUX1 of the multiplexer circuit 10 is coupled to a first control signal line M_G1, the second control terminal MUX2 of the multiplexer circuit 10 is coupled to a second control signal line M_G2, and the third control terminal MUX3 of the multiplexer circuit 10 is coupled to a third control signal line M_G3, the fourth control terminal MUX4 of the multiplexer circuit 10 is coupled to a fourth control signal line M_G4, and the power supply voltage terminal S of the multiplexer circuit 10 is coupled to a power supply voltage line V_S.

For example, the power supply voltage terminal S is configured to transmit a direct current (DC) voltage, such as a direct current low voltage. For example, the voltage of the power supply voltage terminal S is the same as a second voltage (a low voltage) of the second voltage terminal V2 to which the second electrode of the light-emitting device L is coupled. That is, the voltage of the power supply voltage terminal S is equal to the second voltage.

For example, the power supply voltage terminal and the second voltage terminal are coupled to a same signal line. In this way, the voltage of the power supply voltage terminal and the second voltage of the second voltage terminal may be transmitted by the same signal line. Therefore, the wiring of the display panel is simplified.

For example, the first output terminal OUT1 and the second output terminal OUT2 are coupled to different pixel circuits, and sub-pixels to which the different pixel circuits are belong emit light of a same color. For example, referring to FIG. 5, a first output terminal OUT1 of a multiplexer circuit 10 is coupled to sub-pixels $Q_R$ of the first color in a column of pixels through a data line DL, and a second output terminal OUT2 of the multiplexer circuit 10 is coupled to sub-pixels $Q_R$ of the first color in another column of pixels through another data line DL. A first output terminal OUT1 of another multiplexer circuit 10 is coupled to sub-pixels $Q_G$ of the second color in the column of pixels through a data line DL, and a second output terminal OUT2 of the another multiplexer circuit 10 is coupled to sub-pixels $Q_G$ of the second color in the another column of pixels through another data line DL. A first output terminal OUT1 of yet another multiplexer circuit 10 is coupled to sub-pixels $Q_B$ of the third color in the column of pixels through a data line DL, and a second output terminal OUT2 of the yet another multiplexer circuit 10 is coupled to sub-pixels $Q_B$ of the third color in the another column of pixels through another data line DL.

It will be understood that, an output terminal of the source driver is coupled to an input signal terminal of a multiplexer circuit, and is coupled to two data lines through a first output terminal and a second output terminal of the multiplexer circuit. In this case, a single output terminal of the source driver may output signals to two data lines. Therefore, the number of the output ports of the source driver is reduced, the number of pins bonded between the source driver and the display panel is reduced, and the layout design of the bonding area of the display panel is simplified. As a result, the production cost is reduced and the display effect is improved.

The pixel circuits coupled to the first output terminal OUT1 of the multiplexer circuit 10 and the pixel circuits coupled to the second output terminal OUT2 of the multiplexer circuit 10 are coupled to a same sensing line. In addition, a single sensing line detects threshold voltages (i.e., threshold voltages of driving transistors) of pixel circuits coupled thereto in a time-division manner. For example, the first output terminal OUT1 of the multiplexer circuit 10 is coupled to sub-pixels of the first color in a column of pixels, the second output terminal OUT2 of the multiplexer circuit 10 is coupled to sub-pixels of the first color in another column of pixels, and the sub-pixels of the first color in the column of pixels and the sub-pixels of the first color in the another column of pixels are coupled to a single sensing line. The sensing line may detect a threshold voltage of a pixel circuit in a sub-pixel of the first color in the another column of pixels after detecting a threshold voltage of a pixel circuit in a sub-pixel of the first color in the column of pixels.

In a case where the sensing line detects the threshold voltage of the pixel circuit in the sub-pixel of the first color in the column of pixels coupled to the first output terminal OUT1, the pixel circuit in the sub-pixel of the first color in the column of pixels coupled to the first output terminal OUT1 receive the input signal received at the input signal terminal IN, and the pixel circuits in the sub-pixels of the first color in the another column of pixels coupled to the second output terminal OUT2 does not receive the input signal. Therefore, the data line coupled to the pixel circuit in the sub-pixel of the first color in the column of pixels transmits the input signal, and the another data line coupled to the pixel circuits in the sub-pixels of the first color in the another column of pixels does not transmit the input signal. In some embodiments, when a data line transmits no signal, a potential of a signal of the data line is uncontrolled (e.g., in a floating state), which results the existence of noise interference of the signal of the data line. As a result, the sub-pixels coupled to the second output terminal OUT2 are turned on erroneously, which affects accuracy of the sensing line detecting the threshold voltage of the pixel circuit in the sub-pixel coupled to the first output terminal OUT1.

In light of this, in a case where the sensing line detects the threshold voltage of the pixel circuit in the sub-pixel of the first color in the column of pixels coupled to the first output terminal OUT1, the pixel circuit in the sub-pixel of the first color in the column of pixels coupled to the first output terminal OUT1 receives the input signal received at the input signal terminal IN, the pixel circuits in the sub-pixels of the first color in the another column of pixels coupled to the second output terminal OUT2 receives the voltage of the power supply voltage terminal S, and the another data line coupled to the pixel circuits in the sub-pixels of the first color in the another column of pixels transmits the voltage of the power supply voltage terminal. In this way, it may avoid the noise interference of the signal of the another data line coupled to the second output terminal OUT2 due to the uncontrolled potential of the signal of the another data line, and in turn avoid the sub-pixels coupled to the second output terminal OUT2 to be turned on erroneously, and avoid affecting the accuracy of the sensing line detecting the threshold voltage of the pixel circuit in the sub-pixel coupled to the first output terminal OUT1. As a result, the accuracy of sensing data and the display effect are improved.

Similarly, in a case where the sensing line detects the threshold voltage of the pixel circuit in the sub-pixel of the first color in the another column of pixels coupled to the second output terminal OUT2, the pixel circuit in the sub-pixel of the first color in the another column of pixels coupled to the second output terminal OUT2 receives the input signal received at the input signal terminal IN, the pixel circuits in the sub-pixels of the first color in the column of pixels coupled to the first output terminal OUT1 receive the voltage of the power supply voltage terminal S, and the data line coupled to the pixel circuits in the sub-pixels of the first color in the column of pixels transmits the voltage of the power supply voltage terminal. In this way, it may avoid the noise interference of the signal of the data line coupled to the first output terminal OUT1 due to the uncontrolled potential of the signal of the data line, and in turn avoid the sub-pixels coupled to the first output terminal OUT1 to be turned on erroneously, and avoid affecting the accuracy of the sensing line detecting the threshold voltage of the pixel circuit in the sub-pixel coupled to the second output terminal OUT2. As a result, the accuracy of sensing data and the display effect are improved.

Therefore, in the multiplexer circuit provided in the embodiments of the present disclosure, the first selection sub-circuit transmits the input signal received at the input signal terminal to the first output terminal in response to the first control signal received at the first control terminal, and transmits the voltage of the power supply voltage terminal to the first output terminal in response to the second control signal received at the second control terminal. The second selection sub-circuit transmits the input signal received at the input signal terminal to the second output terminal in response to the third control signal received at the third control terminal, and transmits the voltage of the power supply voltage terminal to the second output terminal in response to the fourth control signal received at the fourth control terminal. In this way, in a case where the sensing line detects the threshold voltages of the pixel circuits in the sub-pixels coupled to the first output terminal, a voltage of the signal of the data line coupled to the second output terminal is the voltage of the power supply voltage terminal. In a case where the sensing line detects the threshold voltages of the pixel circuits in the sub-pixels coupled to the second output terminal, a voltage of the signal of the data line coupled to the first output terminal is the voltage of the power supply voltage terminal. Therefore, in a process of detecting threshold voltages of pixel circuits in sub-pixels coupled to an output terminal of the multiplexer circuit, it may avoid that the noise interference of signal of data line coupled to a remaining output terminal of the multiplexer due to the uncontrolled potential of the signal of the data line coupled to the remaining output terminal of the multiplexer circuit, and in turn avoid sub-pixels coupled to the remaining output terminal to be turned on erroneously, and in turn avoid affecting the accuracy of the sensing line. As a result, the accuracy of sensing data and the display effect are improved.

Figure 6:
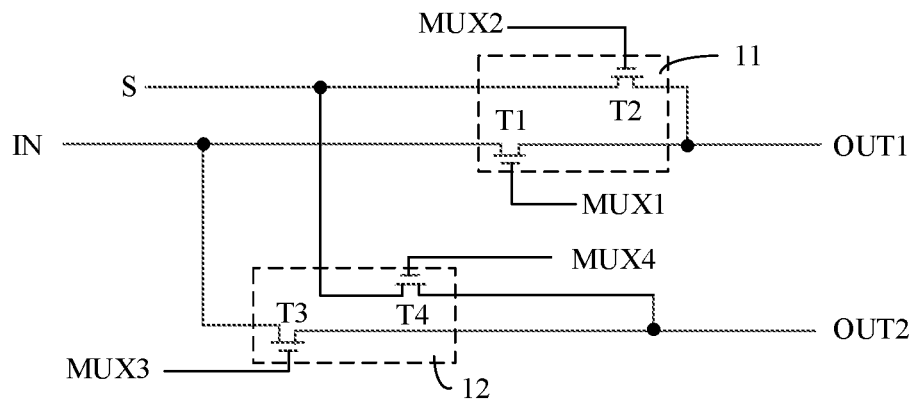
FIG. 6 is a circuit diagram of a multiplexer circuit, in accordance with some embodiments.

For example, as shown in FIG. 6, the first selection sub-circuit 11 includes a first transistor T1 and a second transistor T2.

A control electrode of the first transistor T1 is coupled to the first control terminal MUX1, a first electrode of the first transistor T1 is coupled to the input signal terminal IN, and a second electrode of the first transistor T1 is coupled to the first output terminal OUT1.

A control electrode of the second transistor T2 is coupled to the second control terminal MUX2, a first electrode of the second transistor T2 is coupled to the power supply voltage terminal S, and a second electrode of the second transistor T2 is coupled to the first output terminal OUT1.

For example, as shown in FIG. 6, the second selection sub-circuit 12 includes a third transistor T3 and a fourth transistor T4.

A control electrode of the third transistor T3 is coupled to the third control terminal MUX3, a first electrode of the third transistor T3 is coupled to the input signal terminal IN, and a second electrode of the third transistor T3 is coupled to the second output terminal OUT2.

A control electrode of the fourth transistor T4 is coupled to the fourth control terminal MUX4, a first electrode of the fourth transistor T4 is coupled to the power supply voltage terminal S, and a second electrode of the fourth transistor T4 is coupled to the second output terminal OUT2.

Figure 7:
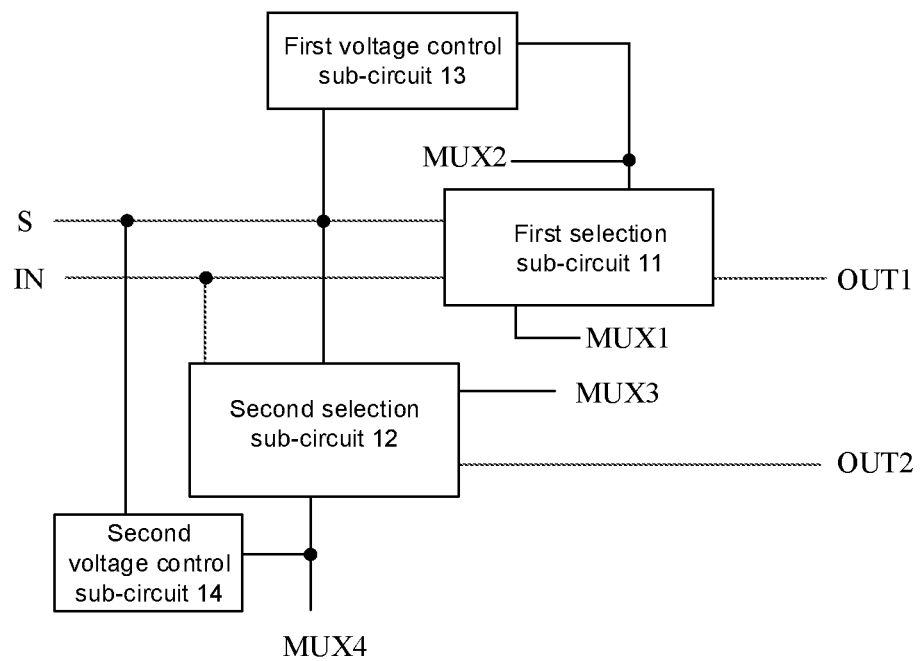
FIG. 7 is a schematic diagram of another multiplexer circuit, in accordance with some embodiments.

In some embodiments, as shown in FIG. 7, the multiplexer circuit 10 further includes a first voltage control sub-circuit 13. The first voltage control sub-circuit 13 is coupled to the power supply voltage terminal S, the second control terminal MUX2 and the first selection sub-circuit 11. The first voltage control sub-circuit 13 is configured to control a voltage of the second control signal received by the first selection sub-circuit 11 at the second control terminal MUX2 according to the voltage of the power supply voltage terminal S and the second control signal received at the second control terminal MUX2. In this case, the first voltage control sub-circuit 13 may control the voltage of the second control signal received by the first selection sub-circuit 11 at the second control terminal MUX2. Thus, in a display phase, the voltage of the second control signal received by the first selection sub-circuit 11 at the second control terminal MUX2 is provided by the first voltage control sub-circuit 13, not by a signal line coupled to the second control terminal MUX2. Therefore, the display apparatus does not need to power on the signal line coupled to the second control terminal MUX2 for a long time. As a result, the power consumption of the display apparatus is reduced.

Figure 8:
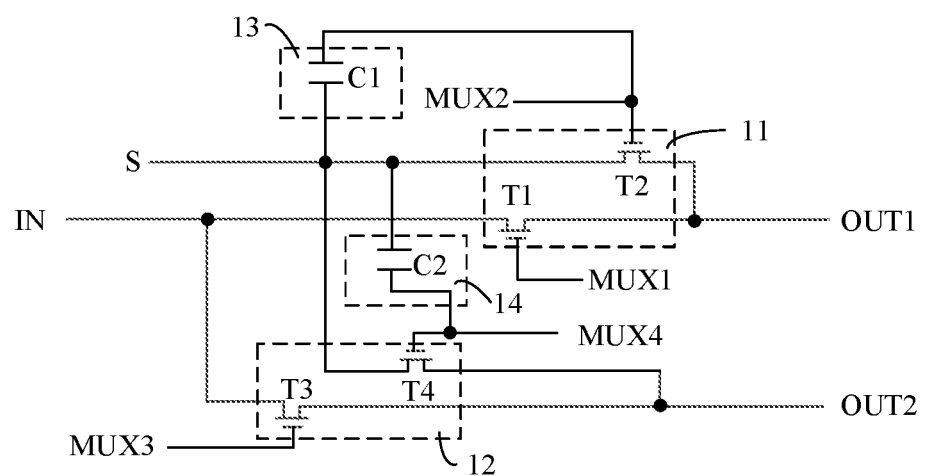
FIG. 8 is a circuit diagram of another multiplexer circuit, in accordance with some embodiments.

For example, as shown in FIG. 8, the first voltage control sub-circuit 13 includes a first capacitor C1. A first terminal of the first capacitor C1 is coupled to the power supply voltage terminal S, and a second terminal of the first capacitor C1 is coupled to the second control terminal MUX2 and the first selection sub-circuit 11.

For example, in a case where the first selection sub-circuit 11 includes the second transistor T2, the second terminal of the first capacitor C1 is coupled to the control electrode of the second transistor T2.

In some embodiments, as shown in FIG. 7, the multiplexer circuit 10 further includes a second voltage control sub-circuit 14. The second voltage control sub-circuit 14 is coupled to the supply voltage terminal S, the fourth control terminal MUX4 and the second selection sub-circuit 12. The second voltage control sub-circuit 14 is configured to control a voltage of the fourth control signal received by the second selection sub-circuit 12 at the fourth control terminal MUX4 according to the voltage of the supply voltage terminal S and the fourth control signal received at the fourth control terminal MUX4. In this case, the second voltage control sub-circuit 14 may control the voltage of the fourth control signal received by the second selection sub-circuit 12 at the fourth control terminal MUX4, so that in the display phase, the voltage of the fourth control signal received by the second selection sub-circuit 12 at the fourth control terminal MUX4 is provided by the second voltage control sub-circuit 14, not by a signal line coupled to the fourth control terminal MUX4. Therefore, the display apparatus does not need to power on the signal line coupled to the fourth control terminal MUX4 for a long time. As a result, the power consumption of the display apparatus is reduced.

For example, as shown in FIG. 8, the second voltage control sub-circuit 14 includes a second capacitor C2. A first terminal of the second capacitor C2 is coupled to the power supply voltage terminal S, and a second terminal of the second capacitor C2 is coupled to the fourth control terminal MUX4 and the second selection sub-circuit 12.

For example, in a case where the second selection sub-circuit 12 includes the fourth transistor T4, the second terminal of the second capacitor C2 is coupled to the control electrode of the fourth transistor T4.

Embodiments of the present disclosure provide a multiplexer circuit. As shown in FIG. 6, the multiplexer circuit 10 includes a first transistor T1, a second transistor T2, a third transistor T3 and a fourth transistor T4.

A control electrode of the first transistor T1 is coupled to a first control terminal MUX1, a first electrode of the first transistor T1 is coupled to an input signal terminal IN, and a second electrode of the first transistor T1 is coupled to a first output terminal OUT1.

A control electrode of the second transistor T2 is coupled to a second control terminal MUX2, a first electrode of the second transistor T2 is coupled to a power supply voltage terminal S, and a second electrode of the second transistor T2 is coupled to the first output terminal OUT1.

A control electrode of the third transistor T3 is coupled to a third control terminal MUX3, a first electrode of the third transistor T3 is coupled to the input signal terminal IN, and a second electrode of the third transistor T3 is coupled to a second output terminal OUT2.

A control electrode of the fourth transistor T4 is coupled to a fourth control terminal MUX4, a first electrode of the fourth transistor T4 is coupled to the power supply voltage terminal S, and a second electrode of the fourth transistor T4 is coupled to the second output terminal OUT2.

It will be noted that, the transistors used in the multiplexer circuit provided in the embodiments of the present disclosure may be TFTs, field effect transistors (FETs) or other switching devices with same characteristics, which is not limited in the embodiments of the present disclosure.

In some embodiments, a control electrode of each transistor used in the multiplexer circuit is a gate of the transistor, a first electrode of the transistor is one of a source and a drain of the transistor, and a second electrode of the transistor is the other of the source and the drain of the transistor. Since the source and the drain of the transistor may be symmetrical in structure, there may be no difference in structure between the source and the drain of the transistor. That is, the first electrode and the second electrode of the transistor in the embodiments of the present disclosure may be the same in structure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In the multiplexer circuit provided in the embodiments of the present disclosure, specific implementation manners of all the sub-circuit are not limited to the manners described above, and may be other implementation manners that are used, such as conventional connection manners well known to a person skilled in the art, as long as the realization of corresponding functions is ensured. The above examples do not limit the protection scope of the present disclosure. In practical applications, a person skilled in the art may choose to use or not to use one or more of the above sub-circuits according to situations. Various combinations and variations based on the above circuits do not depart from the principle of the present disclosure, and details will not be repeated here.

The embodiments of the present disclosure provide a multiplexer. The multiplexer includes a plurality of multiplexer circuits. The plurality of multiplexer circuits are a plurality of multiplexer circuits in any of the above embodiments. For example, referring to FIGS. 9 to 11, the multiplexer 110 includes the plurality of multiplexer circuits (10A, 10B and 10C). For example, the number of the plurality of multiplexer circuits is three.

The input signal terminals IN of the multiplexer circuits 10 in the multiplexer 110 are different, the first output terminals OUT1 of the multiplexer circuits 10 in the multiplexer 110 are different, and the second output terminals OUT2 of the multiplexer circuits 10 in the multiplexer 110 are different. For example, the input signal terminals IN of the multiplexer circuits 10 in the multiplexer 110 receive different input signals; and the input signal terminals IN of the multiplexer circuits 10 in the multiplexer 110 are coupled to different data transmission channels. The first output terminals OUT1 of the multiplexer circuits 10 in the multiplexer 110 are coupled to different sub-pixels. For example, the sub-pixels coupled to the first output terminals OUT1 of the multiplexer circuits 10 in the multiplexer 110 emit light of different colors. The second output terminals OUT2 of the multiplexer circuits 10 in the multiplexer 110 are coupled to different sub-pixels. For example, the sub-pixels coupled to the second output terminals OUT2 of the multiplexer circuits 10 in the multiplexer 110 emit light of different colors. However, sub-pixels coupled to the first output terminal OUT1 of each multiplexer circuit 10 and sub-pixels coupled to the second output terminal OUT2 of the multiplexer circuit 10 emit light of a same color.

In some embodiments, the display panel further includes at least one multiplexer, and each multiplexer is coupled to pixels in the plurality of pixels.

For example, the multiplexer is coupled to pixel circuits in the pixels. The pixels may be at least two pixels. For example, the multiplexer is coupled to adjacent two columns of pixels. For example, the multiplexer is coupled to pixels in an odd-numbered column and pixels in an even-numbered column. For example, the first output terminal of each multiplexer circuit in the multiplexer is coupled to the pixels in the odd-numbered column, and the second output terminal of each multiplexer circuit in the multiplexer is coupled to the pixels in the even-numbered column.

For example, each pixel includes the plurality of sub-pixels; and in each multiplexer, the first output terminal of each multiplexer circuit is coupled to sub-pixels of a same color in different pixels, and the second output terminal of the multiplexer circuit is coupled to sub-pixels of another same color in the different pixels.

For example, each pixel includes three sub-pixels, there are three multiplexer circuits in the multiplexer, and each multiplexer circuit is coupled to pixel circuits in sub-pixels that emit light of a same color in the pixels. For example, referring to FIG. 12A, the pixels include at least one pixel $P_O$ and at least one pixel $P_E$, the at least one pixel $P_O$ is located in an odd-numbered column of pixels, and the at least one pixel $P_E$ is located in an even-numbered column of pixels.

Figure 12A:
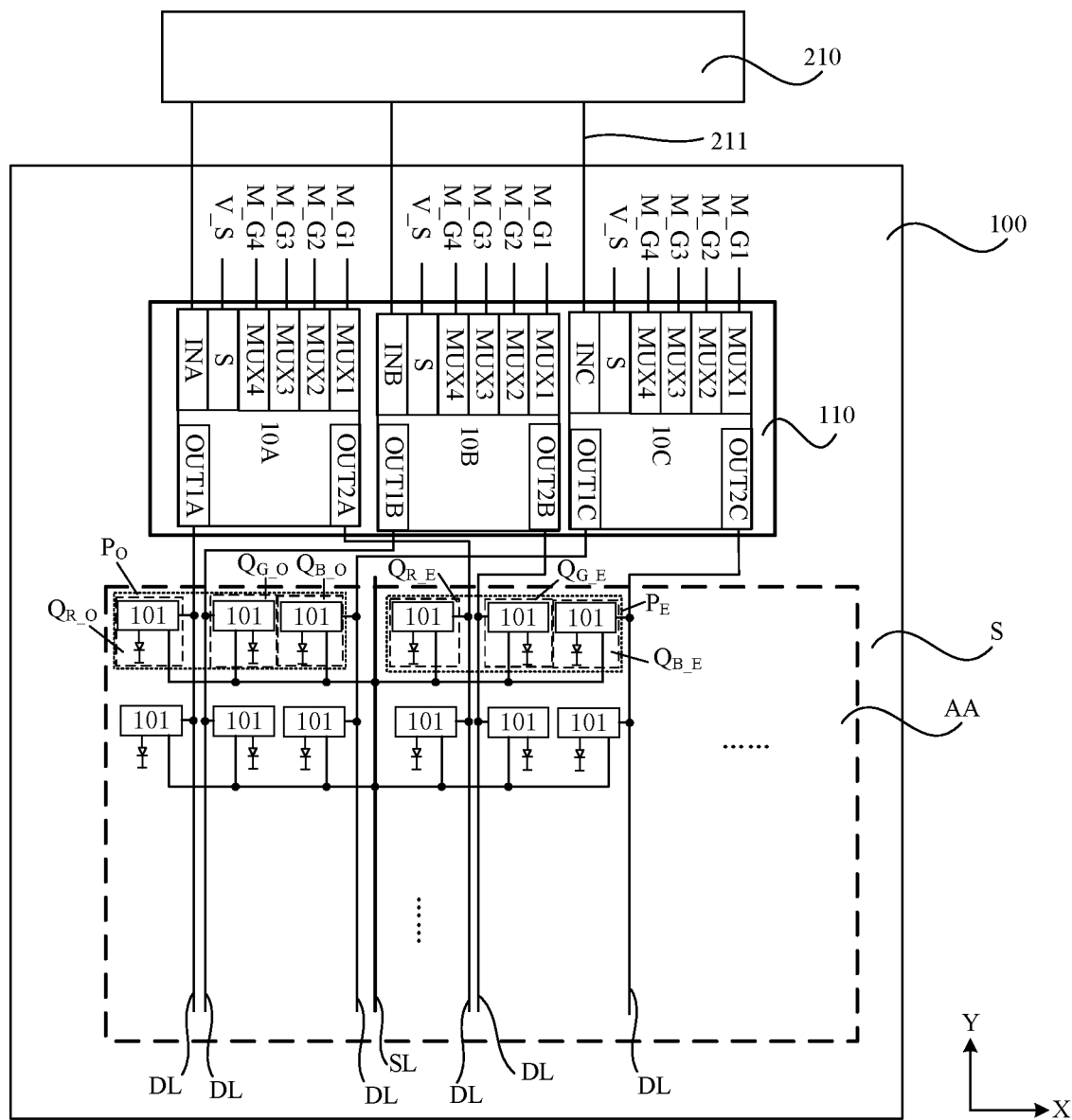
FIG. 12A is a schematic diagram of another display apparatus, in accordance with some embodiments.
Figure 12B:
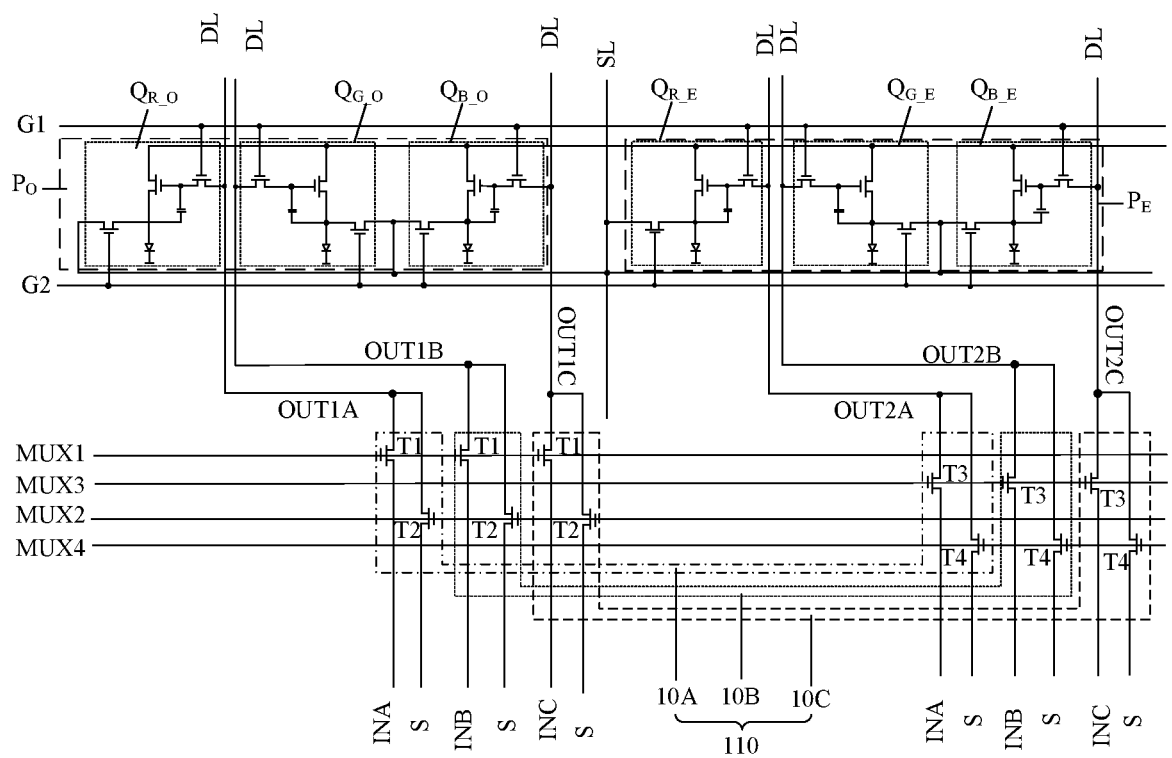
FIG. 12B is a diagram showing a connection relationship between a multiplexer and pixels, in accordance with some embodiments.

For example, referring to FIGS. 12A and 12B, three sub-pixels in the pixel $P_O$ in the pixels are a sub-pixel $Q_{R\_O}$ of the first color, a sub-pixel $Q_{G\_O}$ of the second color and a sub-pixel $Q_{B\_O}$ of the third color. Three sub-pixels in the pixel $P_E$ in the pixels are a sub-pixel $Q_{R\_E}$ of the first color, a sub-pixel $Q_{G\_E}$ of the second color and a sub-pixel $Q_{B\_E}$ of the third color. The multiplexer circuits 10 in the multiplexer 110 are a multiplexer circuit 10A, a multiplexer circuit 10B and a multiplexer circuit 10C. The multiplexer circuit 10A is coupled to the sub-pixel $Q_{R\_O}$ of the first color in the pixel $P_O$ and the sub-pixel $Q_{R\_E}$ of the first color in the pixel $P_E$. For example, the first output terminal OUT1A of the multiplexer circuit 10A is coupled to the sub-pixel $Q_{R\_O}$ of the first color, and the second output terminal OUT2A of the multiplexer circuit 10A is coupled to the sub-pixel $Q_{R\_E}$ of the first color. The first output terminal OUT1A of the multiplexer circuit 10A is coupled to sub-pixels $Q_{R\_O}$ of the first color in a column, and the second output terminal OUT2A of the multiplexer circuit 10A is coupled to sub-pixels $Q_{R\_E}$ of the first color in a column. The multiplexer circuit 10B is coupled to the sub-pixel $Q_{G\_O}$ of the second color in the pixel $P_O$ and the sub-pixel $Q_{G\_E}$ of the second color in the pixel $P_E$. For example, a first output terminal OUT1B of the multiplexer circuit 10B is coupled to the sub-pixel $Q_{G\_O}$ of the second color, and the second output terminal OUT2B of the multiplexer circuit 10B is coupled to the sub-pixel $Q_{G\_E}$ of the second color. The first output terminal OUT1B of the multiplexer circuit 10B is coupled to sub-pixels $Q_{G\_O}$ of the second color in a column, and the second output terminal OUT2B of the multiplexer circuit 10B is coupled to sub-pixels $Q_{G\_E}$ of the second color in a column. The multiplexer circuit 100 is coupled to the sub-pixel $Q_{B\_O}$ of the third color in the pixel $P_O$ and the sub-pixel $Q_{B\_E}$ of the third color in the pixel $P_E$. For example, a first output terminal OUT1C of the multiplexer circuit 100 is coupled to the sub-pixel $Q_{B\_O}$ of the third color, and a second output terminal OUT2C of the multiplexer circuit 100 is coupled to the sub-pixel $Q_{B\_E}$ of the third color. The first output terminal OUT1C of the multiplexer circuit 10C is coupled to sub-pixels $Q_{B\_O}$ of the third color in a column, and the second output terminal OUT2C of the multiplexer circuit 10C is coupled to sub-pixels $Q_{B\_E}$ of the third color in a column.

The input signal received by the multiplexer circuit at the input signal terminal is related to gray scales required to be displayed by sub-pixels coupled to the first output terminal and gray scales required to be displayed by sub-pixels coupled to the second output terminal of the multiplexer circuit. For example, an input signal received by the multiplexer circuit 10A at an input signal terminal INA may be a data signal of the first color, so that the sub-pixel $Q_{R\_O}$ of the first color and the sub-pixel $Q_{R\_E}$ of the first color each display a corresponding gray scale of the sub-pixel of the first color after receiving the data signal of the first color. An input signal received by the multiplexer circuit 10B at an input signal terminal INB may be a data signal of the second color, so that the sub-pixel $Q_{G\_O}$ of the second color and the sub-pixel $Q_{G\_E}$ of the second color each display a corresponding gray scale of the sub-pixel of the second color after receiving the data signal of the second color. An input signal received by the multiplexer circuit 100 at an input signal terminal INC may be a data signal of the third color, so that the sub-pixel $Q_{B\_O}$ of the third color and the sub-pixel $Q_{B\_E}$ of the third color each display a corresponding gray scale of the sub-pixel of the third color after receiving the data signal of the third color.

Figure 13A:
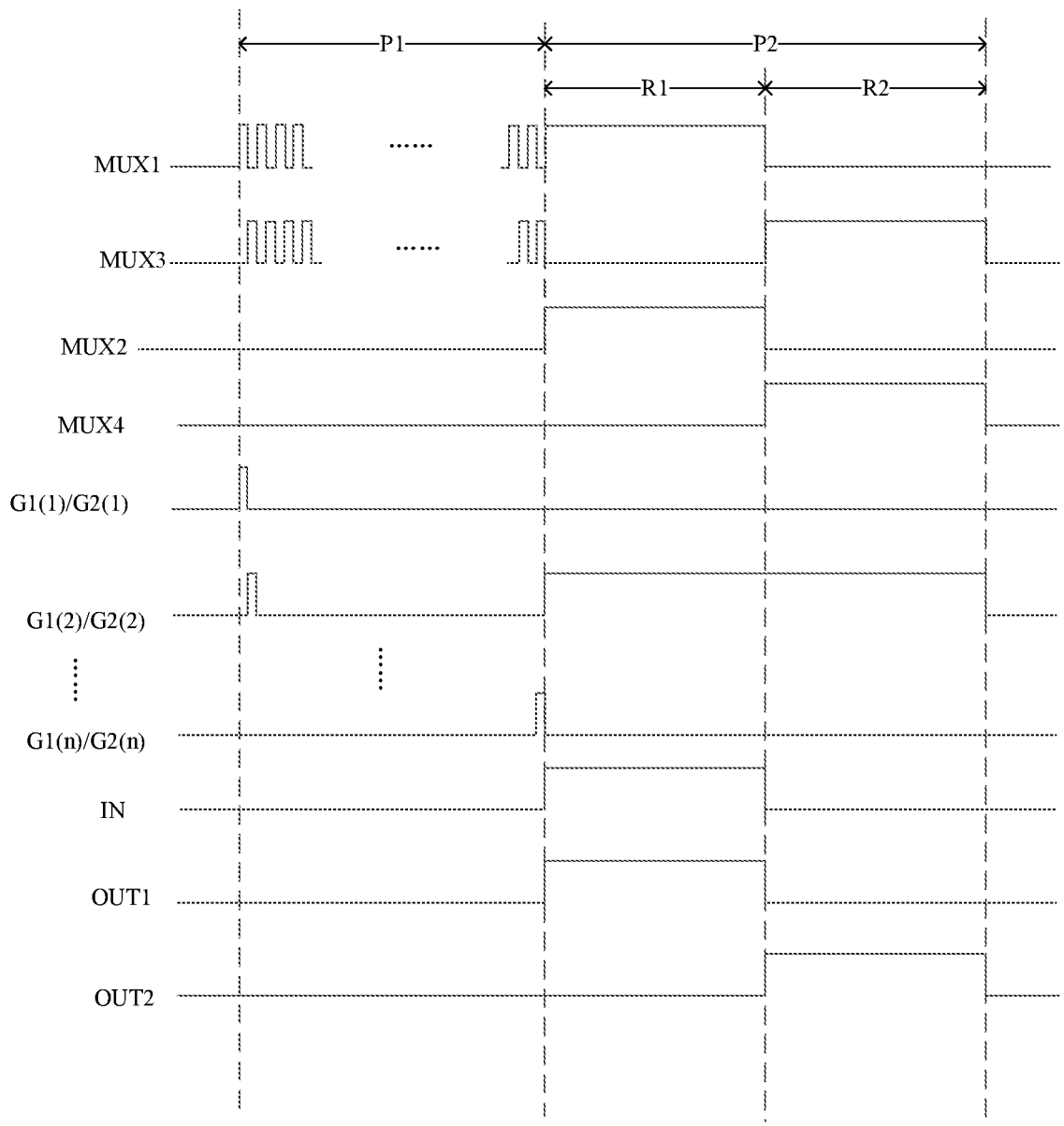
FIG. 13A is a driving timing diagram of a multiplexer circuit, in accordance with some embodiments.
Figure 13B:
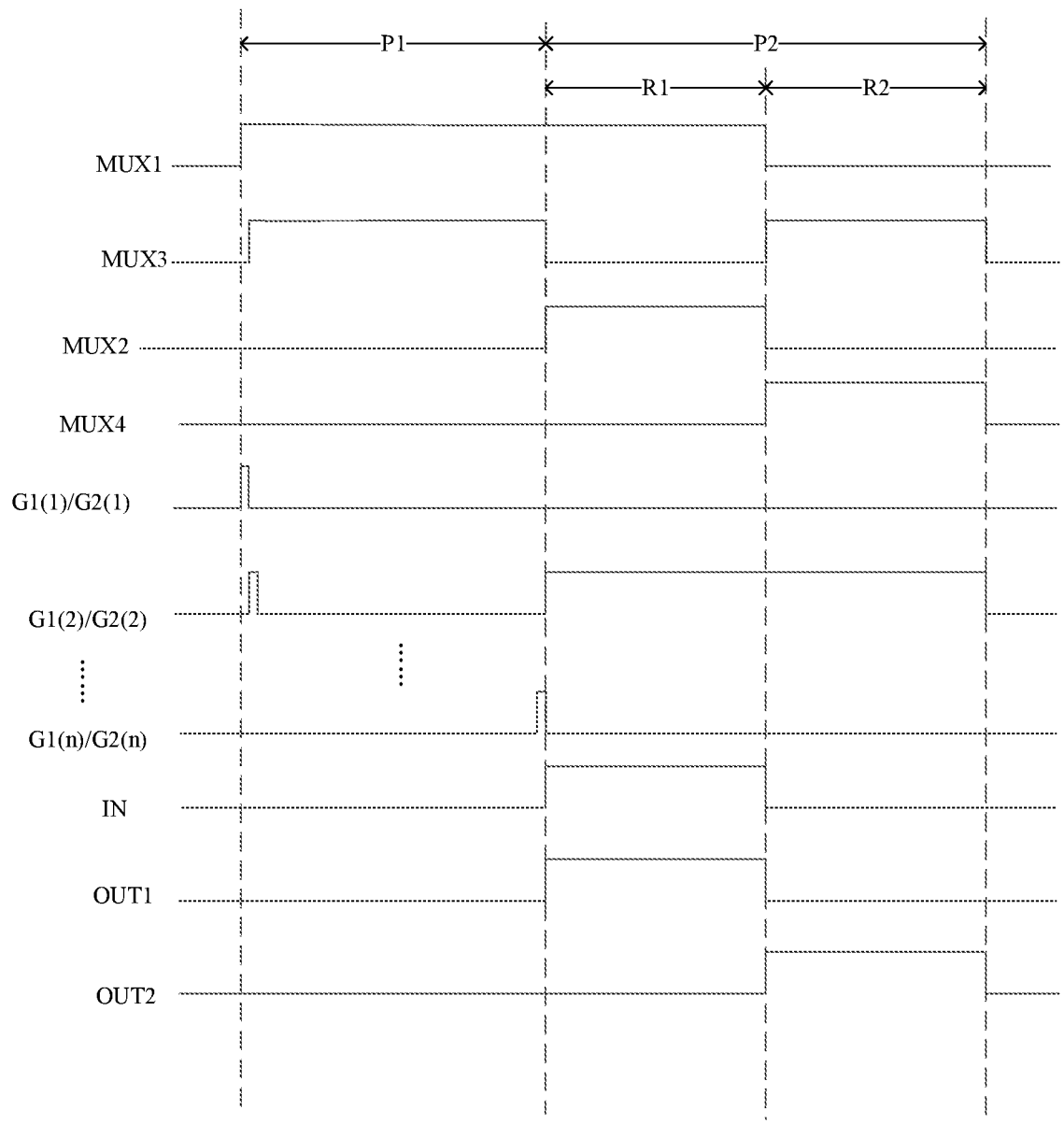
FIG. 13B is a driving timing diagram of another multiplexer circuit, in accordance with some embodiments.

With reference to timings in FIGS. 13A and 13B, the working process of the multiplexer circuit will be described below. Here, each transistor in the multiplexer circuit is an N-type transistor.

In a first phase (P1), the first selection sub-circuit in the multiplexer circuit transmits the input signal received at the input signal terminal to the first output terminal in response to the first control signal received at the first control terminal. The second selection sub-circuit in the multiplexer circuit transmits the input signal received at the input signal terminal to the second output terminal in response to the third control signal received at the third control terminal. For example, in this phase, the input signal received at the input signal terminal is a reference signal. For example, a voltage of the reference signal is 0 V.

For example, referring to FIG. 4, the first selection sub-circuit 11 in the multiplexer circuit 10 transmits the input signal received at the input signal terminal IN to the first output terminal OUT1 in response to the first control signal received at the first control terminal MUX1. The second selection sub-circuit 12 in the multiplexer circuit 10 transmits the input signal received at the input signal terminal IN to the second output terminal OUT2 in response to the third control signal received at the third control terminal MUX3.

For example, referring to FIG. 6, in response to a high-voltage first control signal, the first transistor T1 is turned on and transmits a low-voltage input signal received at the input signal terminal IN to the first output terminal OUT1, so that an output signal of the first output terminal OUT1 is a low-voltage signal. In response to a high-voltage third control signal, the third transistor T3 is turned on and transmits the low-voltage input signal received at the input signal terminal IN to the second output terminal OUT2, so that an output signal of the second output terminal OUT2 is a low-voltage signal. In this case, signals transmitted on the data line coupled to the first output terminal OUT1 and the data line coupled to the second output terminal OUT2 are low-voltage signals, and all sub-pixels coupled to the first output terminal OUT1 and the second output terminal OUT2 are reset.

It will be noted that, in a case where the display panel includes n rows of pixels and each sub-pixel corresponds to a single pixel circuit, in the first phase, a first row of sub-pixels to an n-th row of sub-pixels are scanned row by row. For example, the first row of sub-pixels to the n-th row of sub-pixels are reset row by row. Therefore, full screen is reset. For example, in the first phase, the first row of sub-pixels to the n-th row of sub-pixels sequentially receive first scan signals G1 and second scan signals G2 row by row (e.g., the first row of sub-pixels receives a first scan signal G1(1) and a second scan signal G2(1), the n-th row of sub-pixels receives a first scan signal G1(n) and a second scan signal G2(n)), and signals output by the multiplexer circuit are written into pixel circuits in corresponding sub-pixels.

For example, in the first phase (P1), for the pixel in the first row, in a case where the first scan signal G1(1) and the second scan signal G2(1) are at high levels, referring to FIG. 3, the switching transistor M1 in the pixel circuit is turned on in response to the high-voltage first scan signal (i.e., the high-level first scan signal), writes the low-voltage signal output by the first output terminal OUT1 of the multiplexer circuit to the control electrode of the driving transistor M2, so as to reset the driving transistor M2. The sensing transistor M3 is turned on in response to the high-voltage second scan signal (i.e., the high-level second scan signal), and writes the low-voltage signal output by the second output terminal OUT2 of the multiplexer circuit into the first electrode of the light-emitting device L, so as to reset the light-emitting device L. As a result, the sub-pixel is reset. It will be noted that the working conditions of pixel circuits in sub-pixels in remaining rows are similar to the working conditions of the pixel circuit in the sub-pixel in the first row, and details will not be repeated here. A second phase is started after the sub-pixels in the first row to the sub-pixels in the n-th row are reset row by row.

It will be noted that, in the first phase, the first control signal and the third control signal may be clock signals (with reference to FIG. 13A), and the first control signal and the third control signal are inverted signals. For example, in a case where the first control signal is a high-voltage signal, the third control signal is a low-voltage signal, and in a case where first control signal is a low-voltage signal, the third control signal is a high-voltage signal. In this way, the first selection sub-circuit 11 and the second selection sub-circuit 12 in the multiplexer circuit 10 may work alternately. For example, the first selection sub-circuit 11 and the second selection sub-circuit 12 may output low-voltage signals alternately. That is, the first output terminal OUT1 and the second output terminal OUT2 output low-voltage signals alternately. Alternatively, the first control signal and the third control signal may be the same DC signal (with reference to FIG. 13B). For example, the first control signal and the third control signal are both DC high-voltage signals. In this way, the first selection sub-circuit 11 and the second selection sub-circuit 12 in the multiplexer circuit 10 may work simultaneously. For example, the first selection sub-circuit 11 and the second selection sub-circuit 12 may output low-voltage signals simultaneously. That is, the first output terminal OUT1 and the second output terminal OUT2 output low-voltage signals simultaneously.

In a first period (R1) of the second phase (P2), the first selection sub-circuit in the multiplexer circuit transmits the input signal received at the input signal terminal to the first output terminal in response to the first control signal received at the first control terminal. The second selection sub-circuit in the multiplexer circuit transmits the voltage of the power supply voltage terminal to the second output terminal in response to the fourth control signal received at the fourth control terminal.

For example, referring to FIG. 4, the first selection sub-circuit 11 in the multiplexer circuit 10 transmits the input signal received at the input signal terminal IN to the first output terminal OUT1 in response to the first control signal received at the first control terminal MUX1. The second selection sub-circuit 12 in the multiplexer circuit 10 transmits the voltage of the power supply voltage terminal S to the second output terminal OUT2 in response to the fourth control signal received at the fourth control terminal MUX4.

For example, referring to FIG. 6, the first transistor T1 is turned on in response to a high-voltage first control signal, and transmits a high-voltage input signal received at the input signal terminal IN to the first output terminal OUT1, so that the output signal of the output terminal OUT1 is a high-voltage signal. The fourth transistor T4 is turned on in response to a high-voltage fourth control signal, and transmits a low voltage of the power supply voltage terminal S to the second output terminal OUT2, so that the output signal of the second output terminals OUT2 is a low-voltage signal.

In this case, the data line coupled to the first output terminal OUT1 transmits the high-voltage signal, and the data line coupled to the second output terminal OUT2 transmits the low-voltage signal. In this way, a pixel circuit in a sub-pixel coupled to the first output terminal OUT1 is input with the high-voltage signal. For example, a switching transistor in the pixel circuit is turned on (for example, a switching transistor in a pixel circuit in a pixel in the second row is turned on in response to a high-voltage first scan signal G1(2)), and the switching transistor writes the high-voltage signal to a control electrode (i.e., a gate) of a driving transistor, so that a voltage of the gate of the driving transistor is a high voltage, and the driving transistor is turned on. A sensing transistor is turned on (for example, a sensing transistor in the pixel circuit in the pixel in the second row is turned on in response to a high-voltage second scan signal G2(2)), and the sensing line detects a voltage of a source of the driving transistor through the sensing transistor, so as to sense a threshold voltage of the driving transistor in the pixel circuit in the sub-pixel coupled to the first output terminal OUT1. In addition, a pixel circuit in a sub-pixel coupled to the second output terminal OUT2 is input with the low-voltage signal. For example, a switching transistor in the pixel circuit writes the low-voltage signal into a control electrode (i.e., a gate) of a driving transistor, so that a voltage of the gate of the driving transistor is a low voltage, and the driving transistor is turned off. Therefore, a threshold voltage of the driving transistor in the pixel circuit in the sub-pixel coupled to the second output terminal OUT2 will not affect the sensing of the threshold voltage of the driving transistor in the pixel circuit in the sub-pixel coupled to the first output terminal OUT1. Thus, in a process in which the sensing line detects the threshold voltage of the driving transistor in the pixel circuit in the sub-pixel coupled to the first output terminal OUT1, it may prevent the sub-pixel coupled to the second output terminal OUT2 from being turned on erroneously due to the noise interference caused by the uncontrolled state (e.g., the floating state) of the potential of the sub-pixel coupled to the second output terminal OUT2, and it may avoid affecting the accuracy of the sensing line detecting the threshold voltage of the pixel circuit in the sub-pixel coupled to the first output terminal OUT1, so that the accuracy of sensing data and the display effect are improved.

In a second period (R2) of the second phase (P2), the first selection sub-circuit in the multiplexer circuit transmits the voltage of the power supply voltage terminal to the first output terminal in response to the second control signal received at the second control terminal. The second selection sub-circuit in the multiplexer circuit transmits the input signal received at the input signal terminal to the second output terminal in response to the third control signal received at the third control terminal.

For example, referring to FIG. 4, the first selection sub-circuit 11 in the multiplexer circuit 10 transmits the voltage of the power supply voltage terminal S to the first output terminal OUT1 in response to the second control signal received at the second control terminal MUX2. The second selection sub-circuit 12 in the multiplexer circuit 10 transmits the input signal received at the input signal terminal IN to the second output terminal OUT2 in response to the third control signal received at the third control terminal MUX3.

For example, referring to FIG. 6, the second transistor T2 is turned on in response to a high-voltage second control signal, and transmits the low voltage of the power supply voltage terminal to the first output terminal OUT1, so that the output signal of the first output terminal OUT1 is a low-voltage signal. The third transistor T3 is turned on in response to a high-voltage third control signal, and transmits a high-voltage input signal received at the input signal terminal IN to the second output terminal OUT2, so that the output signal of the second output terminal OUT2 is a high-voltage signal.

In this case, the data line coupled to the first output terminal OUT1 transmits the low-voltage signal, and the data line coupled to the second output terminal OUT2 transmits the high-voltage signal. In this way, the pixel circuit in the sub-pixel coupled to the second output terminal OUT2 is input with the high-voltage signal. For example, the switching transistor in the pixel circuit writes the high-voltage signal into the control electrode (i.e., the gate) of the driving transistor, so that the voltage of the gate of the driving transistor is a high voltage, and the driving transistor is turned on. The sensing transistor is in an on state, the sensing line detects a voltage of the source of the driving transistor through the sensing transistor, so as to sense the threshold voltage of the driving transistor in the pixel circuit in the sub-pixel coupled to the second output terminal OUT2. In addition, the pixel circuit in the sub-pixel coupled to the first output terminal OUT1 is input with the low-voltage signal. For example, the switching transistor in the pixel circuit writes the low-voltage signal into the control electrode (i.e., the gate) of the driving transistor, so that the voltage of the gate of the driving transistor is a low voltage, and the driving transistor is turned off. Therefore, the threshold voltage of the driving transistor in the pixel circuit in the sub-pixel coupled to the first output terminal OUT1 will not affect the sensing of the threshold voltage of the driving transistor in the pixel circuit in the sub-pixel coupled to the second output terminal OUT2. Thus, in a process in which the sensing line may detect the threshold voltage of the driving transistor in the pixel circuit in the sub-pixel coupled to the second output terminal OUT2, it may prevent the sub-pixel coupled to the first output terminal OUT1 from being turned on erroneously due to the noise interference caused by the uncontrolled state (e.g., the floating state) of the potential of the sub-pixel coupled to the first output terminal OUT1, and it may avoid affecting the accuracy of the sensing line detecting the threshold voltage of the pixel circuit in the sub-pixel coupled to the second output terminal OUT2, so that the accuracy of sensing data and the display effect are improved.

It will be noted that, the sub-pixel coupled to the first output terminal of the multiplexer circuit and the sub-pixel coupled to the second output terminal of the multiplexer circuit are located in pixels in different columns. For example, the first output terminal OUT1 of the multiplexer circuit 10 may be coupled to sub-pixels of a single color in pixels in an odd-numbered column, and the second output terminal OUT2 of the multiplexer circuit 10 may be coupled to sub-pixels of a corresponding same color in pixels in an even-numbered column. For example, the first output terminal OUT1 may be coupled to sub-pixels of the first color in the pixels in the odd-numbered column, and the second output terminal OUT2 may be coupled to sub-pixels of the first color in the pixels in the even-numbered column. In addition, pixel circuits in all sub-pixels coupled to the multiplexer circuit may be coupled to a single sensing line. In this way, the single sensing line may detect the threshold voltages of the pixel circuits in the sub-pixels coupled to the multiplexer circuit in a time-division manner.

For example, for the multiplexer circuit, in the first phase, the first output terminal and the second output terminal of the multiplexer circuit output low-voltage signals, so that the signal on the data line coupled to the first output terminal and the signal on the data line coupled to the second output terminal are reset; and in the second phase, the sensing line senses the threshold voltages of the pixel circuits in the sub-pixels coupled to the first output terminal and the threshold voltages of the pixel circuits in the sub-pixels coupled to the second output terminal.

Figure 14A:
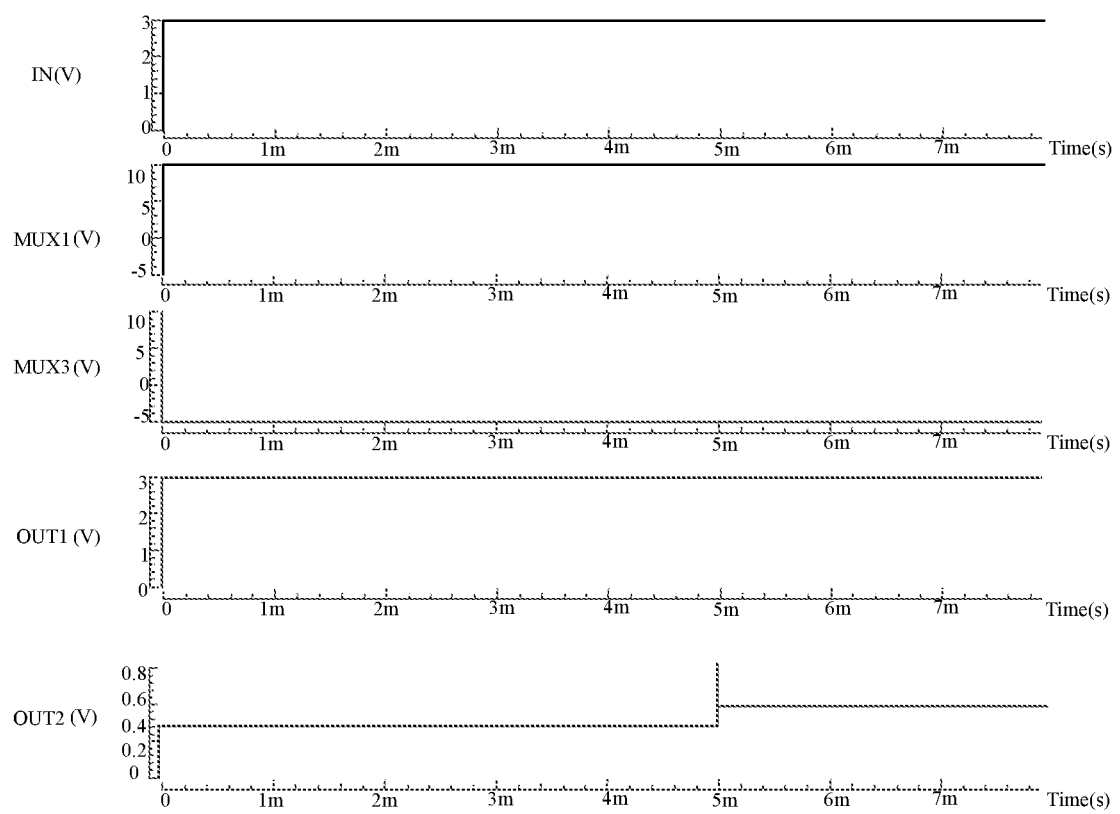
FIGS. 14A and 14B are diagrams showing simulated signals of a multiplexer circuit, in accordance with some embodiments.

For example, in a process of sensing the threshold voltage of the pixel circuit in the sub-pixel coupled to the first output terminal of the multiplexer circuit, the first output terminal of the multiplexer circuit outputs a signal with a high voltage (e.g., the voltage is 3 V), so that the voltage of the signal transmitted by the data line coupled to the first output terminal is the high voltage. In a case where the second output terminal of the multiplexer circuit outputs no signal, the data line coupled to the second output terminal transmits no signal, and the data line is in the floating state. Thus, the voltage of the second output terminal rises due to leakage currents of transistors coupled to the data line. For example, as shown in FIG. 14A, the voltage of the second output terminal OUT2 rises from 0 V to approximately 0.4 V, and then the voltage of the second output terminal further rises due to signal noise interference of the data lines. For example, as shown in FIG. 14A, the voltage of the second output terminal OUT2 rises from 0.4 V to approximately 0.6

V. In this case, in a process of sensing the threshold voltage, for example, a sensing time is approximately tens of milliseconds (ms), the noise may be accumulated continuously, which may cause the signal on the data line coupled to the second output terminal to reach a large voltage. Consequently, the driving transistor in the pixel circuit coupled to the second output terminal is turned on erroneously, and the sensing line is charged, which affects the accuracy of sensing the threshold voltage in the pixel circuit coupled to the first output terminal.

Figure 14B:
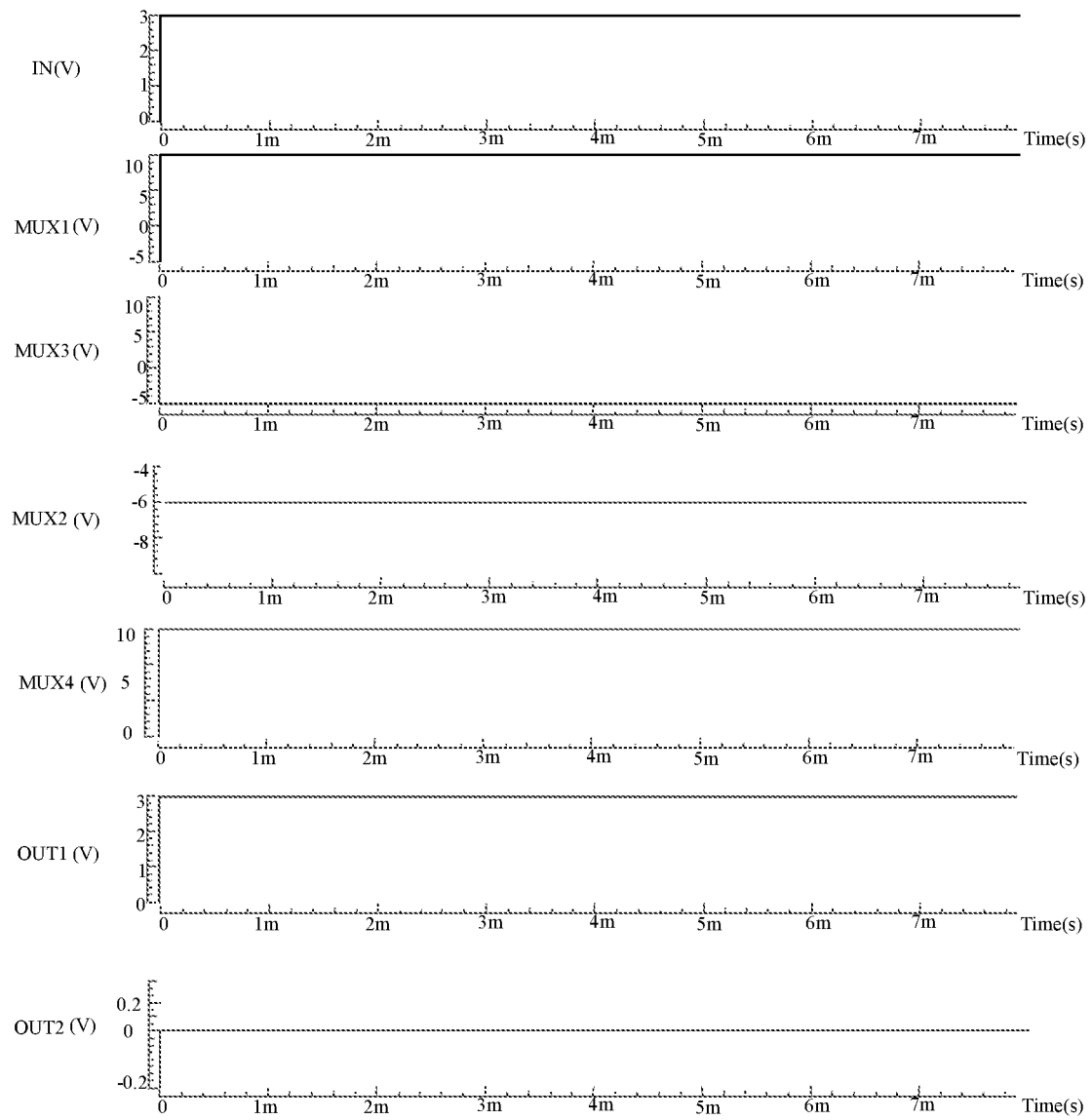

In light of this, in the embodiments of the present disclosure, in the process of sensing the threshold voltage of the pixel circuit in the sub-pixel coupled to the first output terminal of the multiplexer circuit, a signal is transmitted on the data line coupled to the second output terminal (a voltage of the signal transmitted on the data line is the voltage of the power voltage terminal). For example, as shown in FIG. 14B, the voltage of the second output terminal OUT2 is 0 V, and the voltage of the signal transmitted on the data line coupled to the second output terminal OUT2 is 0 V. In this way, the signal of the data line coupled to the second output terminal may be prevented from being interfered, the noise may be reduced, an anti-interference performance of the circuit may be improved, the driving transistor in the pixel circuit coupled to the second output terminal may be prevented from being turned on, and the accuracy of sensing the threshold voltage may be improved.

Figure 15:
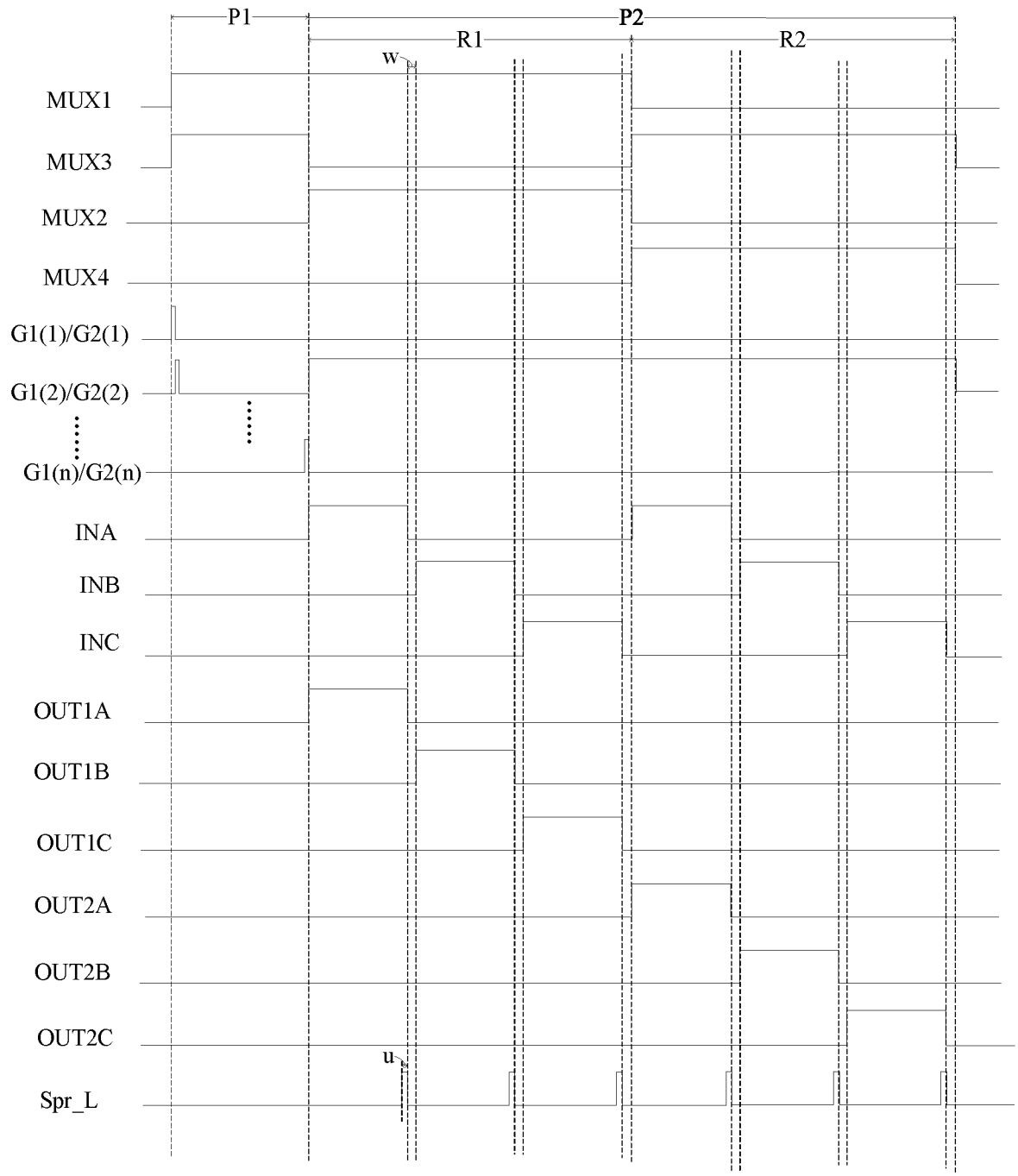
FIG. 15 is a driving timing diagram of a multiplexer, in accordance with some embodiments.

With reference to the timing in FIG. 15, a working process of a multiplexer will be described below. Here, each transistor in each multiplexer circuit of the multiplexer is an N-type transistor.

For example, a single multiplexer may be coupled to two columns of pixels. For example, the two columns of pixels are an odd-numbered column of pixels and an even-numbered column of pixels. For example, the odd-numbered column of pixels and the even-numbered column of pixels that are coupled to the multiplexer are adjacent. For example, a threshold voltage of a pixel circuit in each sub-pixel in each column of pixels to which the multiplexer is coupled may be detected by a single sensing line. For example, each pixel includes three sub-pixels, which are a sub-pixel of the first color, a sub-pixel of the second color, and a sub-pixel of the third color. For example, referring to FIG. 12A, there are three multiplexer circuits in the multiplexer 110, and the three multiplexer circuits are the multiplexer circuit 10A, the multiplexer circuit 10B, and the multiplexer circuit 10C. The first output terminal OUT1A of the multiplexer circuit 10A, the first output terminal OUT1B of the multiplexer circuit 10B, and the first output terminal OUT1C of the multiplexer circuit 10C are respectively coupled to sub-pixels of the first color, sub-pixels of the second color, and sub-pixels of the third color in the odd-numbered column of pixels. The second output terminal OUT2A of the multiplexer circuit 10A, the second output terminal OUT2B of the multiplexer circuit 10B, and the second output terminal OUT2C of the multiplexer circuit 100 are respectively coupled to sub-pixels of the first color, sub-pixels of the second color, and sub-pixels of the third color in the even-numbered column of pixels.

In this case, in a first phase, in each multiplexer circuit in the multiplexer, the first selection sub-circuit transmits the input signal received at the input signal terminal to the first output terminal in response to the first control signal received at the first control terminal. The second selection sub-circuit in each multiplexer circuit transmits the input signal received at the input signal terminal to the second output terminal in response to the third control signal received at the third control terminal. For example, in this phase, the input signal received at the input signal terminal is a reference signal. For example, a voltage of the reference signal is 0 V.

Figure 9:
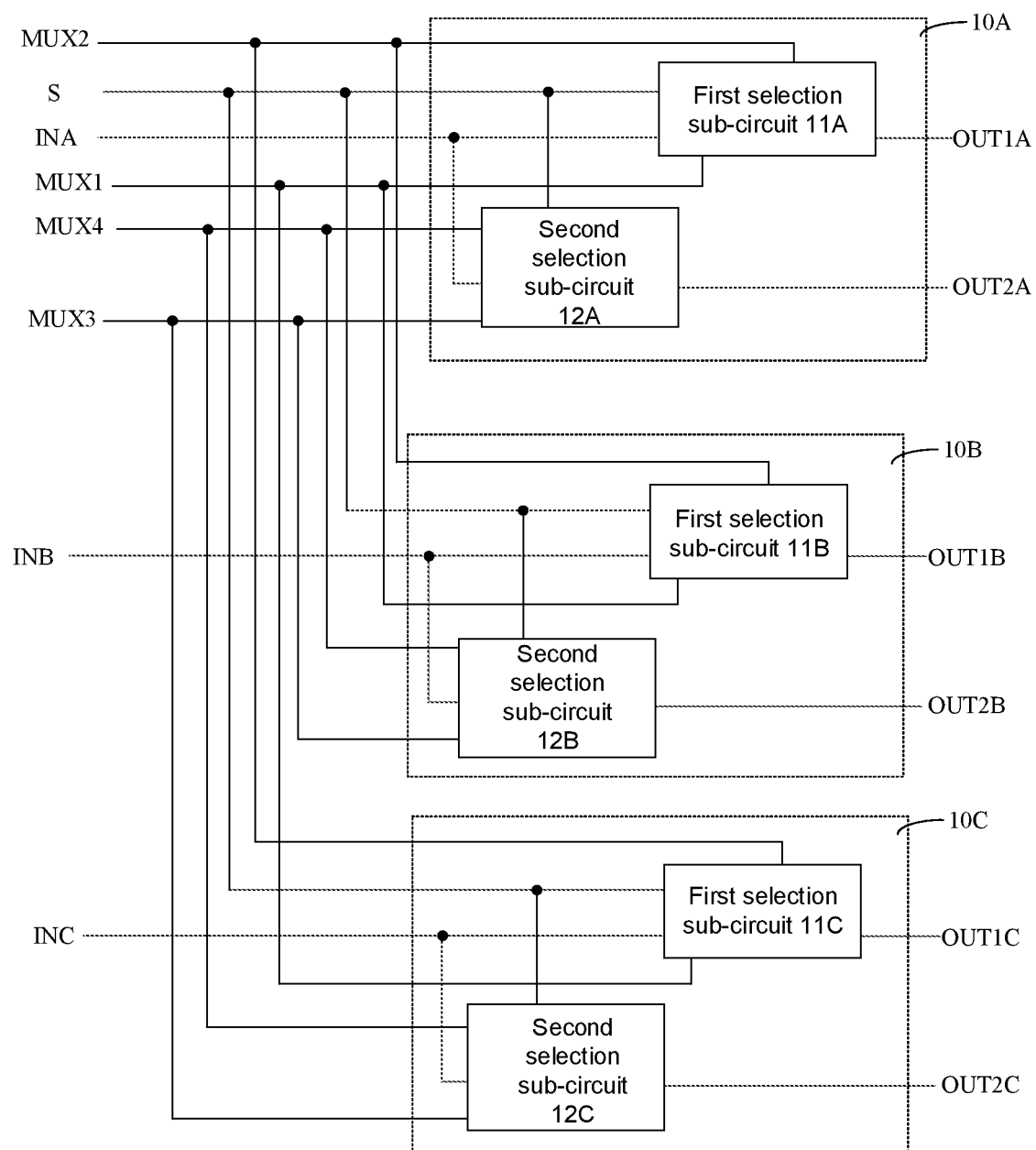
FIG. 9 is a schematic diagram of a multiplexer, in accordance with some embodiments.

For example, referring to FIG. 9, in the multiplexer 110, the first selection sub-circuit 11A in the multiplexer circuit 10A transmits the input signal received at the input signal terminal INA to the first output terminal OUT1A in response to the first control signal received at the first control terminal MUX1; the second selection sub-circuit 12A in the multiplexer circuit 10A transmits the input signal received at the input signal terminal INA to the second output terminal OUT2A in response to the third control signal received at the third control terminal MUX3; the first selection sub-circuit 11B in the multiplexer circuit 10B transmits the input signal received at the input signal terminal INB to the first output terminal OUT1B in response to the first control signal received at the first control terminal MUX1; the second selection sub-circuit 12B in the multiplexer circuit 10B transmits the input signal received at the input signal terminal INB to the second output terminal OUT2B in response to the third control signal received at the third control terminal MUX3; the first selection sub-circuit 11C in the multiplexer circuit 100 transmits an input signal received at the input signal terminal INC to the first output terminal OUT1C in response to the first control signal received at the first control terminal MUX1; and the second selection sub-circuit 12C in the multiplexer circuit 100 transmits the input signal received at the input signal terminal INC to the second output terminal OUT2C in response to the third control signal received at the third control terminal MUX3.

Figure 10:
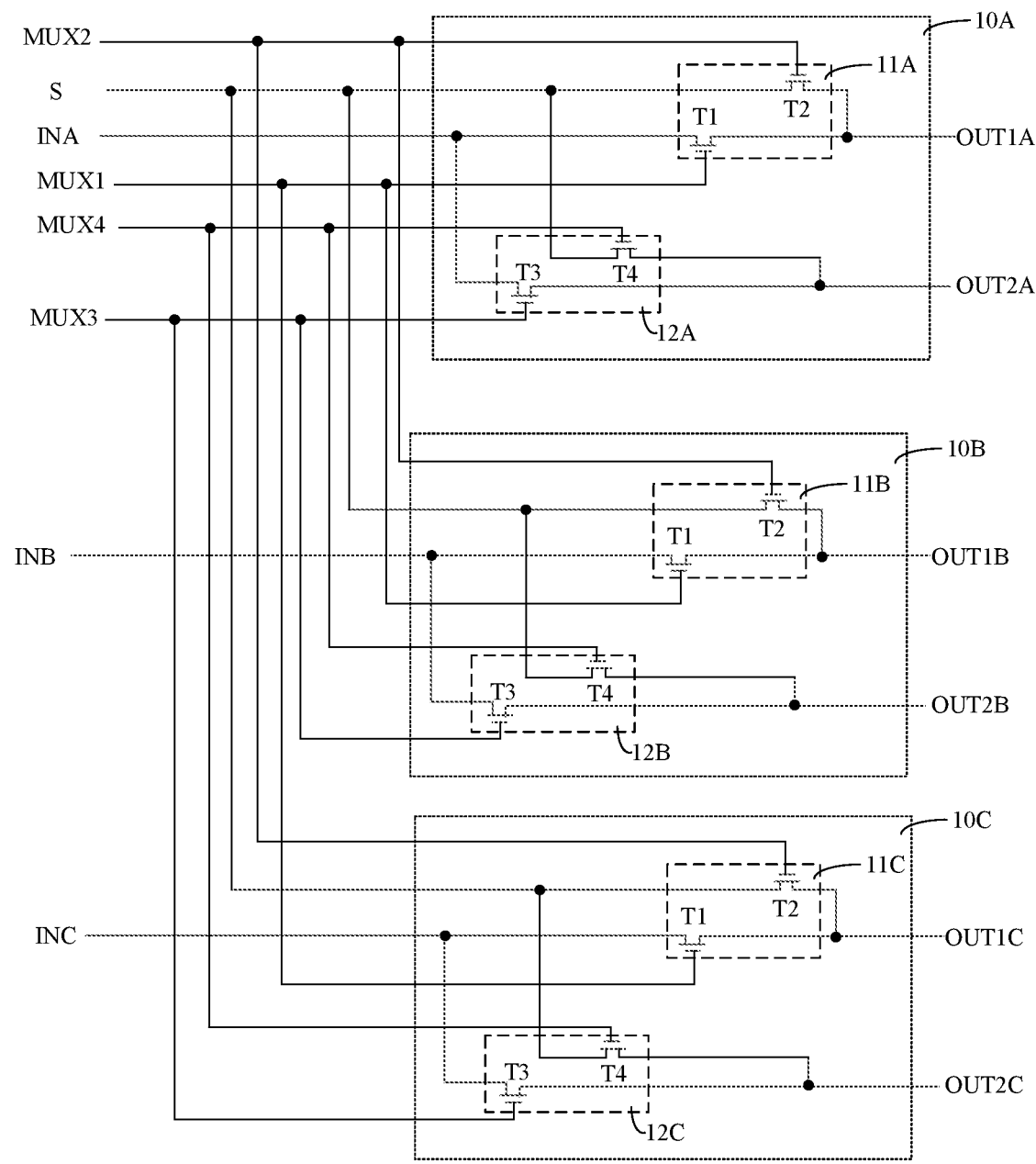
FIG. 10 is a circuit diagram of yet another multiplexer, in accordance with some embodiments.
Figure 11:
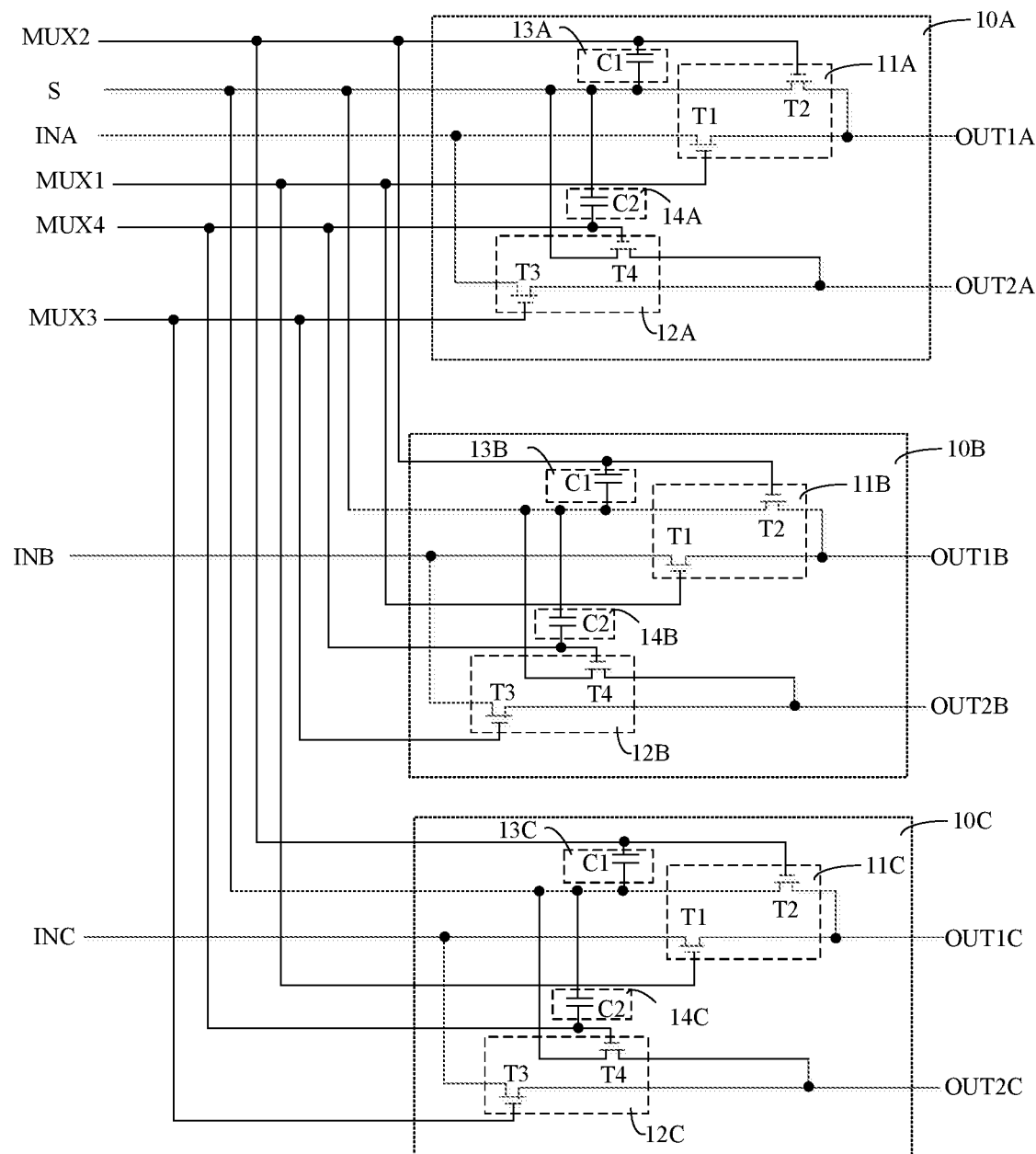
FIG. 11 is a circuit diagram of yet another multiplexer, in accordance with some embodiments.

For example, referring to FIG. 10, in the multiplexer circuit 10A, a first transistor T1 is turned on in response to a high-voltage first control signal, and transmits a low-voltage input signal received at the input signal terminal INA to the first output terminal OUT1A, so that an output signal of the first output terminal OUT1A is a low-voltage signal; a third transistor T3 is turned on in response to a high-voltage third control signal, and transmits the low-voltage input signal received at the input signal terminal INA to the second output terminal OUT2A, so that an output signal of the second output terminal OUT2A is a low-voltage signal. In this case, signals transmitted on the data line coupled to the first output terminal OUT1A and the data line coupled to the second output terminal OUT2A are low-voltage signals, and all sub-pixels coupled to the first output terminal OUT1A and all sub-pixels coupled to the second output terminal OUT2A are reset.

In the multiplexer circuit 10B, a first transistor T1 is turned on in response to the high-voltage first control signal, and transmits a low-voltage input signal received at the input signal terminal INB to the first output terminal OUT1B, so that an output signal of the first output terminal OUT1B is a low-voltage signal. A third transistor T3 is turned on in response to the high-voltage third control signal, and transmits the low-voltage input signal received at the input signal terminal INB to the second output terminal OUT2B, so that an output signal of the second output terminal OUT2B is a low-voltage signal. In this case, signals transmitted on the data line coupled to the first output terminal OUT1B and the data line coupled to the second output terminal OUT2B are low-voltage signals, and all sub-pixels coupled to the first output terminal OUT1B and all sub-pixels coupled to the second output terminal OUT2B are reset.

In the multiplexer circuit 100, a first transistor T1 is turned on in response to the high-voltage first control signal, and transmits a low-voltage input signal received at the input signal terminal INC to the first output terminal OUT1C, so that an output signal of the first output terminal OUT1C is a low-voltage signal. A third transistor T3 is turned on in response to the high-voltage third control signal, and transmits the low-voltage input signal received at the input signal terminal INC to the second output terminal OUT2C, so that an output signal of the second output terminal OUT2C is a low-voltage signal. In this case, signals transmitted on the data line coupled to the first output terminal OUT1C and the data line coupled to the second output terminal OUT2C are low-voltage signals, and all sub-pixels coupled to the first output terminal OUT1C and all sub-pixels coupled to the second output terminal OUT2C are reset.

It will be noted that, in the first phase, the first control signal and the third control signal may be inverted signals, or the first control signal and the third control signal may be a same DC signal. For example, the first control signal and the third control signal are both DC high voltage signals.

It will be understood that, in the first phase, all rows of sub-pixels in the display panel are reset row by row. For each row of sub-pixels, in a case where the first scan signal and the second scan signal are at high levels, a switching transistor in a pixel circuit is turned on in response to the high-voltage first scan signal (i.e., the high-level first scan signal), and writes a low-voltage signal output by a first output terminal of a corresponding multiplexer circuit in the multiplexer into a control electrode of the driving transistor in the pixel circuit, so as to reset the driving transistor. A sensing transistor in the pixel circuit is turned on in response to the high-voltage second control signal (i.e., the high-level second control signal), and writes a low-voltage signal output by a second output terminal of the corresponding multiplexer circuit in the multiplexer into a first electrode of a light-emitting device, so that the light-emitting device is reset, and the sub-pixel is reset. In this way, in the first phase, the display panel achieves full screen reset, and in this case, the display panel does not display images (for example, the display panel is in a shutdown state).

In a first period of a second phase, the first selection sub-circuit in the multiplexer circuit in the multiplexer transmits the input signal received at the input signal terminal to the first output terminal in response to the first control signal received at the first control terminal, and the second selection sub-circuit in each multiplexer circuit in the multiplexer transmits the voltage of the power supply voltage terminal to the second output terminal in response to the fourth control signal received at the fourth control terminal.

For example, referring to FIG. 9, in the multiplexer 110, the first selection sub-circuit 11A in the multiplexer circuit 10A transmits the input signal received at the input signal terminal INA to the first output terminal OUT1A in response to the first control signal received at the first control terminal MUX1, and the second selection sub-circuit 12A in the multiplexer circuit 10A transmits the voltage of the power supply voltage terminal S to the second output terminal OUT2A in response to the fourth control signal received at the fourth control terminal MUX4. The first selection sub-circuit 11B in the multiplexer circuit 10B transmits the input signal received at the input signal terminal INB to the first output terminal OUT1B in response to the first control signal received at the first control terminal MUX1, and the second selection sub-circuit 12B in the multiplexer circuit 10B transmits the voltage of the power supply voltage terminal S to the second output terminal OUT2B in response to the fourth control signal received at the fourth control terminal MUX4. The first selection sub-circuit 11C in the multiplexer circuit 100 transmits the input signal received at the input signal terminal INC to the first output terminal OUT1C in response to the first control signal received at the first control terminal MUX1, and the second selection sub-circuit 12C in the multiplexer circuit 10C transmits the voltage of the power supply voltage terminal S to the second output terminal OUT2C in response to the fourth control signal received at the fourth control terminal MUX4.

For example, referring to FIG. 10, in the multiplexer circuit 10A, the first transistor T1 is turned on in response to a high-voltage first control signal, and transmits a high-voltage input signal received at the input signal terminal INA to the first output terminal OUT1A, so that an output signal of the first output terminal OUT1A is a high-voltage signal; and a fourth transistor T4 is turned on in response to a high-voltage fourth control signal, and transmits the low voltage of the power supply voltage terminal S to the second output terminal OUT2A, so that an output signal of the second output terminal OUT2A is a low-voltage signal. In the multiplexer circuit 10B, the first transistor T1 is turned on in response to the high-voltage first control signal, and transmits a low-voltage input signal (e.g., the reference voltage) received at the input signal terminal INB to the first output terminal OUT1B, so that an output signal of the first output terminal OUT1B is a low-voltage signal; and a fourth transistor T4 is turned on in response to the high-voltage fourth control signal, and transmits the low voltage of the power supply voltage terminal S to the second output terminal OUT2B, so that an output signal of the second output terminal OUT2B is a low-voltage signal. In the multiplexer circuit 10C, the first transistor T1 is turned on in response to the high-voltage first control signal, and transmits a low-voltage input signal (e.g., the reference voltage) received at the input signal terminal INC to the first output terminal OUT1C, so that an output signal of the first output terminal OUT1C is a low-voltage signal; and a fourth transistor T4 is turned on in response to the high-voltage fourth control signal, and transmits the low voltage of the power supply voltage terminal S to the second output terminal OUT2C, so that an output signal of the second output terminal OUT2C is a low-voltage signal.

In this case, in the multiplexer 110, a data line coupled to the first output terminal OUT1A of the multiplexer circuit 10A transmits the high-voltage signal, and signals transmitted on data lines coupled to remaining output terminals are low-voltage signals. In this way, a pixel circuit in a sub-pixel coupled to the first output terminal OUT1A of the multiplexer circuit 10A is input with the high-voltage signal. For example, a switching transistor in the pixel circuit is turned on (for example, a switching transistor in a pixel circuit in a pixel in the second row is turned on in response to a high-voltage first scan signal G1(2)), and writes the high-voltage signal to a control electrode (i.e., a gate) of a driving transistor, so that a voltage of the gate of the driving transistor is a high voltage, and the driving transistor is turned on. A sensing transistor in the pixel circuit is in an on state (for example, a sensing transistor in the pixel circuit in the pixel in the second row is turned on in response to a high-voltage second scan signal G2(2)), and a sensing line detects a voltage of a source of the driving transistor through the sensing transistor, so as to sense a threshold voltage of the driving transistor in the pixel circuit in the sub-pixel coupled to the first output terminal OUT1A of the multiplexer circuit 10A. In addition, pixel circuits in sub-pixels coupled to the remaining output terminals are input with low-voltage signals. For example, switching transistors in the pixel circuits write the low-voltage signals into control electrodes (i.e., gates) of driving transistors, so that voltages of the gates of the driving transistors are low voltages, and the driving transistors are all in an off state. Thus, threshold voltages of the driving transistors in the pixel circuits in the sub-pixels coupled to the remaining output terminals will not affect the sensing of the threshold voltage of the driving transistor in the pixel circuit in the sub-pixel coupled to the first output terminal OUT1A of the multiplexer circuit 10A. Therefore, in the process in which the sensing line detects the threshold voltage of the driving transistor in the pixel circuit in the sub-pixel (e.g., a sub-pixel of the first color in a pixel in an odd-numbered column) coupled to the first output terminal OUT1A of the multiplexer circuit 10A, it may avoid that the sub-pixels coupled to the remaining output terminals are turned on erroneously due to noise interference caused by the uncontrolled state (e.g., the floating state) of potentials of the sub-pixels coupled to the remaining output terminals, and it may avoid affecting accuracy of the sensing line detecting the threshold voltage of the pixel circuit in the sub-pixel coupled to the first output terminal OUT1A of the multiplexer circuit 10A. As a result, the accuracy of sensing data and the display effect are improved.

It will be noted that, in a case where the sensing line is coupled to pixel circuits, threshold voltages of driving transistors in the pixel circuits need to be sensed in a time-division manner. For example, a single sensing line is coupled to pixel circuits in adjacent two columns of pixels, the sensing line senses threshold voltages of driving transistors in the pixel circuits at different times. For example, each sensing line may sense a threshold voltages of a sub-pixel of the first color, a sub-pixel of the second color and a sub-pixel of the third color in a pixel in an odd-numbered column coupled thereto, and then sense threshold voltages of a sub-pixel of the first color, a sub-pixel of the second color and a sub-pixel of the third color in a pixel in an even-numbered column coupled thereto. For example, all pixels in the display panel are sensed row by row, and the sensing line senses threshold voltages corresponding to pixel circuits in sub-pixels in pixels in a row coupled to the sensing line column by column.

For example, sensing threshold voltages of driving transistors in pixel circuits in sub-pixels coupled to the first output terminal OUT1A of the multiplexer circuit 10A is to sense threshold voltages of pixel circuits in sub-pixels of the first color in pixels in an odd-numbered column.

For example, referring to FIG. 10, in the multiplexer circuit 10A, the first transistor T1 is turned on in response to a high-voltage first control signal, and transmits a low-voltage input signal (e.g., the reference voltage) received at the input signal terminal INA to the first output terminal OUT1A, so that the output signal of the first output terminal OUT1A is a low-voltage signal; the fourth transistor T4 is turned on in response to a high-voltage fourth control signal, and transmits the low voltage of the power supply voltage terminal S to the second output terminal OUT2A, so that the output signal of the second output terminal OUT2A is a low-voltage signal. In the multiplexer circuit 10B, the first transistor T1 is turned on in response to the high-voltage first control signal, and transmits a high-voltage input signal received at the input signal terminal INB to the first output terminal OUT1B, so that the output signal of the first output terminal OUT1B is a high-voltage signal; the fourth transistor T4 is turned on in response to the high-voltage fourth control signal, and transmits the low voltage of the power supply voltage terminal S to the second output terminal OUT2B, so that the output signal of the second output terminal OUT2B is a low-voltage signal. In the multiplexer circuit 10C, the first transistor T1 is turned on in response to the high-voltage first control signal, and transmits a low-voltage input signal with (e.g., the reference voltage) received at the input signal terminal INC to the first output terminal OUT1C, so that the output signal of the first output terminal OUT1C is a low-voltage signal; the fourth transistor T4 is turned on in response to the high-voltage fourth control signal, and transmits the low voltage of the power supply voltage terminal S to the second output terminal OUT2C, so that the output signal of the second output terminal OUT2C is a low-voltage signal.

In this case, in the multiplexer 110, a data line coupled to the first output terminal OUT1B of the multiplexer circuit 10B transmits the high-voltage signal, and signals transmitted on data lines coupled to remaining output terminals are low-voltage signals. In this way, a pixel circuit in a sub-pixel coupled to the first output terminal OUT1B of the multiplexer circuit 10B is input with the high-voltage signal. For example, a switching transistor in the pixel circuit writes the high-voltage signal into a control electrode (i.e., a gate) of a driving transistor, so that a voltage of the gate of the driving transistor is a high voltage, and the driving transistor is turned on. A sensing transistor in the pixel circuit is in an on state, and the sensing line detects a voltage of a source of the driving transistor through the sensing transistor, so as to sense a threshold voltage of the driving transistor in the pixel circuit in the sub-pixel coupled to the first output terminal OUT1B of the multiplexer circuit 10B. In addition, pixel circuits in sub-pixels coupled to the remaining output terminals are input with low-voltage signals. For example, switching transistors in the pixel circuits write the low-voltage signals into control electrodes (i.e., gates) of driving transistors, so that voltages of the gates of the driving transistors are low voltages, and the driving transistors are all in an off state. Thus, threshold voltages of the driving transistors in the pixel circuits in the sub-pixels coupled to the remaining output terminals will not affect the sensing of the threshold voltage of the driving transistor in the pixel circuit in the sub-pixel coupled to the first output terminal OUT1B of the multiplexer circuit 10B. Therefore, in the process in which the sensing line detects the threshold voltage of the driving transistor in the pixel circuit in the sub-pixel (e.g., a sub-pixel of the second color in the pixel in the odd-numbered column) coupled to the first output terminal OUT1B of the multiplexer circuit 10B, it may avoid that the sub-pixels coupled to the remaining output terminals are turned on erroneously due to noise interference caused by the uncontrolled state (e.g., the floating state) of potentials of the sub-pixels coupled to the remaining output terminals, and it may avoid affecting accuracy of the sensing line detecting the threshold voltage of the pixel circuit in the sub-pixel coupled to the first output terminal OUT1B of the multiplexer circuit 10B. As a result, the accuracy of sensing data and the display effect are improved.

For example, referring to FIG. 10, in the multiplexer circuit 10A, the first transistor T1 is turned on in response to a high-voltage first control signal, and transmits a low-voltage input signal (e.g., the reference voltage) received at the input signal terminal INA to the first output terminal OUT1A, so that the output signal of the first output terminal OUT1A is a low-voltage signal. The fourth transistor T4 is turned on in response to a high-voltage fourth control signal, and transmits the low voltage of the power supply voltage terminal S to the second output terminal OUT2A, so that the output signal of the second output terminal OUT2A is a low-voltage signal. In the multiplexer circuit 10B, the first transistor T1 is turned on in response to the high-voltage first control signal, and transmits the low-voltage input signal (e.g., the reference voltage) received at the input signal terminal INB to the first output terminal OUT1B, so that the output signal of the first output terminal OUT1B is a low-voltage signal. The fourth transistor T4 is turned on in response to the high-voltage fourth control signal, and transmits the low voltage of the power supply voltage terminal S to the second output terminal OUT2B, so that the output signal of the second output terminal OUT2B is a low-voltage signal. In the multiplexer circuit 10C, the first transistor T1 is turned on in response to the high-voltage first control signal, and transmits the high-voltage input signal received at the input signal terminal INC to the first output terminal OUT1C, so that the output signal of the first output terminal OUT1C is a high-voltage signal. The fourth transistor T4 is turned on in response to the high-voltage fourth control signal, and transmits the low voltage of the power supply voltage terminal S to the second output terminal OUT2C, so that the output signal of the second output terminal OUT2C is a low-voltage signal.

In this case, in the multiplexer 110, a data line coupled to the first output terminal OUT1C of the multiplexer circuit 100 transmits the high-voltage signal, and signals transmitted on data lines coupled to remaining output terminals are low-voltage signals. In this way, a pixel circuit in a sub-pixel coupled to the first output terminal OUT1C of the multiplexer circuit 100 is input with the high-voltage signal. For example, a switching transistor in the pixel circuit writes the high-voltage signal into a control electrode (i.e., a gate) of a driving transistor, so that a voltage of the gate of the driving transistor is a high voltage, and the driving transistor will be turned on. A sensing transistor in the pixel circuit is in an on state, and the sensing line detects a voltage of a source of the driving transistor through the sensing transistor, so that a threshold voltage of the driving transistor in the pixel circuit in the sub-pixel coupled to the first output terminal OUT1C of the multiplexer circuit 100 is sensed. In addition, pixel circuits in sub-pixels coupled to the remaining output terminals are input with low-voltage signals. For example, switching transistors in the pixel circuits write the low-voltage signals into control electrodes (i.e., gates) of driving transistors, so that voltages of the gates of the driving transistors are low voltages, and the driving transistors are all in an off state. Thus, threshold voltages of the driving transistors in the pixel circuits in the sub-pixels coupled to the remaining output terminals will not affect the sensing of the threshold voltage of the driving transistor in the pixel circuit in the sub-pixel coupled to the first output terminal OUT1C of the multiplexer circuit 10C. Therefore, in the process in which the sensing line detects the threshold voltage of the driving transistor in the pixel circuit in the sub-pixel (e.g., a sub-pixel of the third color in a pixel in the odd-numbered column) coupled to the first output terminal OUT1C of the multiplexer circuit 100, it may avoid that the sub-pixels coupled to the remaining output terminals are turned on erroneously due to noise interference caused by the uncontrolled state (e.g., the floating state) of potentials of the sub-pixels coupled to the remaining output terminals, and it may avoid affecting accuracy of the sensing line detecting the threshold voltage of the pixel circuit in the sub-pixel coupled to the first output terminal OUT1C of the multiplexer circuit 100. As a result, the accuracy of sensing data and the display effect are improved.

In a second period in the second phase, the first selection sub-circuit in the multiplexer circuit transmits the voltage of the power supply voltage terminal to the first output terminal in response to the second control signal received at the second control terminal, and the second selection sub-circuit in the multiplexer circuit transmits the input signal received at the input signal terminal to the second output terminal in response to the third control signal received at the third control terminal.

For example, referring to FIG. 9, in the multiplexer 110, the first selection sub-circuit 11A in the multiplexer circuit 10A transmits the voltage of the power supply voltage terminal S to the first output terminal OUT1A in response to the second control signal received at the second control terminal MUX2, and the second selection sub-circuit 12A in the multiplexer circuit 10A transmits the input signal received at the input signal terminal INA to the second output terminal OUT2A in response to the third control signal received at the third control terminal MUX3. The first selection sub-circuit 11B in the multiplexer circuit 10B transmits the voltage of the power supply voltage terminal S to the first output terminal OUT1B in response to the second control signal received at the second control terminal MUX2, and the second selection sub-circuit 12B in the multiplexer circuit 10B transmits the input signal received at the input signal terminal INB to the second output terminal OUT2B in response to the third control signal received at the third control terminal MUX3. The first selection sub-circuit 110 in the multiplexer circuit 100 transmits the voltage of the power supply voltage terminal S to the first output terminal OUT1C in response to the second control signal received at the second control terminal MUX2, and the second selection sub-circuit 12C in the multiplexer circuit 100 transmits the input signal received at the input signal terminal INC to the second output terminal OUT2C in response to the third control signal received at the third control terminal MUX3.

For example, referring to FIG. 10, in the multiplexer circuit 10A, a second transistor T2 is turned on in response to a high-voltage second control signal, and transmits the low voltage of the power supply voltage terminal S to the first output terminal OUT1A, so that the output signal of the first output terminal OUT1A is a low-voltage signal. The third transistor T3 is turned on in response to a high-voltage third control signal, and transmits a high-voltage input signal received at the input signal terminal INA to the second output terminal OUT2A, so that the output signal of the second output terminal OUT2A is a high-voltage signal. In the multiplexer circuit 10B, a second transistor T2 is turned on in response to the high-voltage second control signal, and transmits the low voltage of the power supply voltage terminal S to the first output terminal OUT1B, so that the output signal of the first output terminal OUT1B is a low-voltage signal. The third transistor T3 is turned on in response to the high-voltage third control signal, and transmits the low-voltage input signal received at the input signal terminal INB to the second output terminal OUT2B, so that the output signal of the second output terminal OUT2B is a low-voltage signal. In the multiplexer circuit 100, a second transistor T2 is turned on in response to the high-voltage second control signal, and transmits the low voltage of the power supply voltage terminal S to the first output terminal OUT1C, so that the output signal of the first output terminal OUT1C is a low-voltage signal. The third transistor T3 is turned on in response to the high-voltage third control signal, and transmits the low-voltage input signal received at the input signal terminal INC to the second output terminal OUT2C, so that the output signal of the second output terminal OUT2C is a low-voltage signal.

In this case, in the multiplexer 110, a data line coupled to the second output terminal OUT2A of the multiplexer circuit 10A transmits the high-voltage signal, and signals transmitted on data lines coupled to remaining output terminals are low-voltage signals. In this way, a pixel circuit in a sub-pixel coupled to the second output terminal OUT2A of the multiplexer circuit 10A is input with the high-voltage signal. For example, a switching transistor in the pixel circuit writes the high-voltage signal into a control electrode (i.e., a gate) of a driving transistor, so that a voltage of the gate of the driving transistor is a high voltage, and the driving transistor will be turned on. A sensing transistor in the pixel circuit is in an on state, and the sensing line detects a voltage of a source of the driving transistor through the sensing transistor, so that a threshold voltage of the driving transistor in the pixel circuit in the sub-pixel coupled to the second output terminal OUT2A of the multiplexer circuit 10A is sensed. In addition, pixel circuits in sub-pixels coupled to the remaining output terminals are input with low-voltage signals. For example, switching transistors in the pixel circuits write the low-voltage signals into control electrodes (i.e., gates) of driving transistors, so that voltages of the gates of the driving transistors are low voltages, and the driving transistors are all in an off state. Thus, threshold voltages of the driving transistors in the pixel circuits in the sub-pixels coupled to the remaining output terminals will not affect the sensing of the threshold voltage of the driving transistor in the pixel circuit in the sub-pixel coupled to the second output terminal OUT2A of the multiplexer circuit 10A. Therefore, in the process in which the sensing line detects the threshold voltage of the driving transistor in the pixel circuit in the sub-pixel (e.g., a sub-pixel of the first color in a pixel in the even-numbered column) coupled to the second output terminal OUT2A of the multiplexer circuit 10A, it may avoid that the sub-pixels coupled to the remaining output terminals from being turned on erroneously due to noise interference caused by the uncontrolled state (e.g., the floating state) of potentials of the sub-pixels coupled to the remaining output terminals, and it may avoid affecting accuracy of the sensing line detecting the threshold voltage of the pixel circuit in the sub-pixel coupled to the second output terminal OUT2A of the multiplexer circuit 10A. As a result, the accuracy of sensing data and the display effect are improved.

For example, referring to FIG. 10, in the multiplexer circuit 10A, the second transistor T2 is turned on in response to a high-voltage second control signal, and transmits the low voltage of the power supply voltage terminal S to the first output terminal OUT1A, so that the output signal of the first output terminal OUT1A is a low-voltage signal. The third transistor T3 is turned on in response to the high-voltage third control signal, and transmits a low-voltage input signal received at the input signal terminal INA to the second output terminal OUT2A, so that the output signal of the second output terminal OUT2A is a low-voltage signal. In the multiplexer circuit 10B, the second transistor T2 is turned on in response to the high-voltage second control signal, and transmits the low voltage of the power supply voltage terminal S to the first output terminal OUT1B, so that the output signal of the first output terminal OUT1B is a low-voltage signal. The third transistor T3 is turned on in response to the high-voltage third control signal, and transmits a high-voltage input signal received at the input signal terminal INB to the second output terminal OUT2B, so that the output signal of the second output terminal OUT2B is a high-voltage signal. In the multiplexer circuit 10C, the second transistor T2 is turned on in response to the high-voltage second control signal, and transmits the low voltage of the power supply voltage terminal S to the first output terminal OUT1C, so that the output signal of the first output terminal OUT1C is a low-voltage signal. The third transistor T3 is turned on in response to the high-voltage third control signal, and transmits the low-voltage input signal received at the input signal terminal INC to the second output terminal OUT2C, so that the output signal of the second output terminal OUT2C is a low-voltage signal.

In this case, in the multiplexer 110, a data line coupled to the second output terminal OUT2B of the multiplexer circuit 10B transmits the high-voltage signal, and signals transmitted on data lines coupled to remaining output terminals are low-voltage signals. In this way, a pixel circuit in a sub-pixel coupled to the second output terminal OUT2B of the multiplexer circuit 10B is input with the high-voltage signal. For example, a switching transistor in the pixel circuit writes the high-voltage signal into a control electrode (i.e., a gate) of a driving transistor, so that a voltage of the gate of the driving transistor is a high voltage, and the driving transistor will be turned on. A sensing transistor in the pixel circuit is in an on state, and the sensing line detects a voltage of a source of the driving transistor through the sensing transistor, so that a threshold voltage of the driving transistor in the pixel circuit in the sub-pixel coupled to the second output terminal OUT2B of the multiplexer circuit 10B is sensed. In addition, pixel circuits in sub-pixels coupled to the remaining output terminals are input with low-voltage signals. For example, switching transistors in the pixel circuits write the low-voltage signals into control electrodes (i.e., gates) of driving transistors, so that voltages of the gates of the driving transistors are low voltages, and the driving transistors are all in an off state. Thus, threshold voltages of the driving transistors in the pixel circuits in the sub-pixels coupled to the remaining output terminals will not affect the sensing of the threshold voltage of the driving transistor in the pixel circuit in the sub-pixel coupled to the second output terminal OUT2B of the multiplexer circuit 10B. Therefore, in the process in which the sensing line detects the threshold voltage of the driving transistor in the pixel circuit in the sub-pixel (e.g., a sub-pixel of the second color in a pixel in the even-numbered column) coupled to the second output terminal OUT2B of the multiplexer circuit 10B, it may avoid that the sub-pixels coupled to the remaining output terminals are turned on erroneously due to noise interference caused by the uncontrolled state (e.g., the floating state) of potentials of the sub-pixels coupled to the remaining output terminals, and it may avoid affecting accuracy of the sensing line detecting the threshold voltage of the pixel circuit in the sub-pixel coupled to the second output terminal OUT2B of the multiplexer circuit 10B. As a result, the accuracy of sensing data and the display effect are improved.

For example, referring to FIG. 10, in the multiplexer circuit 10A, the second transistor T2 is turned on in response to the high-voltage second control signal, and transmits the low voltage of the power supply voltage terminal S to the first output terminal OUT1A, so that the output signal of the first output terminal OUT1A is a low-voltage signal. The third transistor T3 is turned on in response to the high-voltage third control signal, and transmits a low-voltage input signal received at the input signal terminal INA to the second output terminal OUT2A, so that the output signal of the second output terminal OUT2A is a low-voltage signal. In the multiplexer circuit 10B, the second transistor T2 is turned on in response to the high-voltage second control signal, and transmits the low voltage of the power supply voltage terminal S to the first output terminal OUT1B, so that the output signal of the first output terminal OUT1B is a low-voltage signal. The third transistor T3 is turned on in response to the high-voltage third control signal, and transmits a low-voltage input signal received at the input signal terminal INB to the second output terminal OUT2B, so that the output signal of the second output terminal OUT2B is a low-voltage signal. In the multiplexer circuit 10C, the second transistor T2 is turned on in response to the high-voltage second control signal, and transmits the low voltage of the power supply voltage terminal S to the first output terminal OUT1C, so that the output signal of the first output terminal OUT1C is a low-voltage signal. The third transistor T3 is turned on in response to the high-voltage third control signal, and transmits a high-voltage input signal received at the input signal terminal INC to the second output terminal OUT2C, so that the output signal of the second output terminal OUT2C is a high-voltage signal.

In this case, in the multiplexer 110, a data line coupled to the second output terminal OUT2C of the multiplexer circuit 100 transmits the high-voltage signal, and signals transmitted on data lines coupled to remaining output terminals are low-voltage signals. In this way, a pixel circuit in a sub-pixel coupled to the second output terminal OUT2C of the multiplexer circuit 100 is input with the high-voltage signal. For example, a switching transistor in the pixel circuit writes the high-voltage signal into a control electrode (i.e., a gate) of a driving transistor, so that a voltage of the gate of the driving transistor is a high voltage, and the driving transistor will be turned on. A sensing transistor in the pixel circuit is in an on state, and the sensing line detects a voltage of a source of the driving transistor through the sensing transistor, so that a threshold voltage of the driving transistor in the pixel circuit in the sub-pixel coupled to the second output terminal OUT2C of the multiplexer circuit 100 is sensed. In addition, pixel circuits in sub-pixels coupled to the remaining output terminals are input with low-voltage signals. For example, switching transistors in the pixel circuits write the low-voltage signals into control electrodes (i.e., gates) of driving transistors, so that voltages of the gates of the driving transistors are low voltages, and the driving transistors are all in an off state. Thus, threshold voltages of the driving transistors in the pixel circuits in the sub-pixels coupled to the remaining output terminals will not affect the sensing of the threshold voltage of the driving transistor in the pixel circuit in the sub-pixel coupled to the second output terminal OUT2C of the multiplexer circuit 10C. Therefore, in the process in which the sensing line detects the threshold voltage of the driving transistor in the pixel circuit in the sub-pixel (e.g., a sub-pixel of the third color in a pixel in the even-numbered column) coupled to the second output terminal OUT2C of the multiplexer circuit 100, it may avoid that the sub-pixels coupled to the remaining output terminals are turned on erroneously due to noise interference caused by the uncontrolled state (e.g., the floating state) of potentials of the sub-pixels coupled to the remaining output terminals, and it may avoid affecting accuracy of the sensing line detecting the threshold voltage of the pixel circuit in the sub-pixel coupled to the second output terminal OUT2C of the multiplexer circuit 10C. As a result, the accuracy of sensing data and the display effect are improved.

It will be noted that, each sensing line needs to be reset in a period between an end moment of a period in which the sensing line senses a threshold voltage of a driving transistor of a pixel circuit and a start moment of a period in which the sensing line senses a threshold voltage of a driving transistor of a next pixel circuit. For example, the sensing line is reset in a period (e.g., a period w in FIG. 15) between an end moment of a period in which the sensing line senses a sub-pixel of the first color in a pixel in an odd-numbered column in a row of pixels and a start moment of a period in which the sensing line senses a sub-pixel of the second color in the pixel in the odd-numbered column in the row of pixels. For example, for the second row of pixels, the first scan signal G1(2) and the second scan signal G2(2) continue to be high-voltage signals, switching transistors and sensing transistors in pixel circuits are turned on, input signals are low-voltage signals (i.e., reset signals), and signals on the data lines are low-voltage signals, and in this case, signals on the sensing lines are low-voltage signals.

In some embodiments, in the display phase of the display panel, the data lines in the display panel transmit data signals required for display. In this case, the multiplexer circuit will not output the voltage of the power supply voltage terminal. That is, neither the first output terminal nor the second output terminal will output the voltage of the power supply voltage terminal. For example, in the display phase, the second transistor in the first selection sub-circuit is turned off in response to the second control signal (e.g., a low-voltage signal), and the second transistor will not transmit the voltage of the power supply voltage terminal to the first output terminal. The fourth transistor in the second selection sub-circuit is turned off in response to the fourth control signal (e.g., a low-voltage signal), and the fourth transistor will not transmit the voltage of the power supply voltage terminal to the second output terminal. In this phase, the first transistor in the first selection sub-circuit is turned on in response to the first control signal (e.g., a high-voltage signal), and transmits the input signal from the input signal terminal to the first output terminal. The third transistor in the second selection sub-circuit is turned on in response to the third control signal (e.g., a high-voltage signal), and transmits the input signal from the input signal terminal to the second output terminal. In this way, the data line coupled to the first output terminal and the data line coupled to the second output terminal of the multiplexer circuit each transmit the input signal received at the input signal terminal, so that pixel circuits are input with corresponding input signals and drive light-emitting devices to display different gray scales.

In this case, the first voltage control sub-circuit controls the voltage of the second control signal received by the first selection sub-circuit at the second control terminal according to the voltage of the power supply voltage terminal and the second control signal received at the second control terminal. For example, the voltage of the power supply voltage terminal is a low voltage, and the first voltage control sub-circuit may control the voltage of the second control signal received by the first selection sub-circuit at the second control terminal to be a low voltage according to a low-voltage second control signal received at the second control terminal. For example, the first capacitor in the first voltage control sub-circuit (e.g., a first capacitor C1 in a first voltage control sub-circuit 13A, a first capacitor C1 in a first voltage control sub-circuit 13B or a first capacitor C1 in a first voltage control sub-circuit 13C shown in FIG. 11) stores the low-voltage second control signal due to its storage function, so as to control a voltage of the control electrode of the second transistor in the first selection sub-circuit to be a low voltage, and control the second control signal responded by the second transistor in the first selection sub-circuit to be a low voltage. In this case, the voltage of the control electrode of the second transistor is a low voltage, so that the second transistor is turned off and will not transmit the voltage of the power supply voltage terminal to the first output terminal. Correspondingly, the second voltage control sub-circuit controls a voltage of the fourth control signal received by the second selection sub-circuit at the fourth control terminal according to the voltage of the power supply voltage terminal and the fourth control signal received at the fourth control terminal. For example, the voltage of the power supply voltage terminal is a low voltage, and the second voltage control sub-circuit may control the voltage of the fourth control signal received by the second selection sub-circuit at the fourth control terminal to be a low voltage according to a low-voltage fourth control signal received at the fourth control terminal. For example, the second capacitor in the second voltage control sub-circuit (e.g., a second capacitor C2 in a second voltage control sub-circuit 14A, a second capacitor C2 in a second voltage control sub-circuit 14B ora second capacitor C2 in a second voltage control sub-circuit 14C shown in FIG. 11) stores the low-voltage fourth control signal due to its storage function, so as to control a voltage of the control electrode of the fourth transistor in the second selection sub-circuit to be a low voltage, and control the voltage of the fourth control signal responded by the fourth transistor in the second selection sub-circuit to be a low voltage. In this case, the voltage of the control electrode of the fourth transistor is a low voltage, so that the fourth transistor is turned off and will not transmit the voltage of the power supply voltage terminal to the second output terminal.

On this basis, in the display phase, a second control signal line may transmit the second control signal to the second control terminal coupled thereto within a short time period, the second transistor in the first selection sub-circuit is turned off in response to the second control signal (e.g., a low-voltage signal), and the first capacitor in the first voltage control sub-circuit stores the second control signal. The first capacitor may provide the second control signal for the second transistor, so that the second transistor is maintained in an off state. In this way, in the display phase, the second control signal line does not need to continuously transmit the second control signal to the second control terminal, and the second control signal line may stop supplying power to the second control terminal, so that hardware transient power consumption of the display apparatus may be reduced. Correspondingly, in the display phase, a fourth control signal line may transmit the fourth control signal to the fourth control terminal coupled thereto within a short time period, the fourth transistor in the second selection sub-circuit is turned off in response to the fourth control signal (e.g., a low-voltage signal), and the second capacitor in the second voltage control sub-circuit stores the fourth control signal. The second capacitor may provide the fourth control signal for the fourth transistor, so that the fourth transistor is maintained in an off state. In this way, in the display phase, the fourth control signal line does not need to continuously transmit the fourth control signal to the fourth control terminal, and the fourth control signal line may stop supplying power to the fourth control terminal, so that hardware transient power consumption of the display apparatus may be reduced.

It will be noted that, for the convenience of description, some signal terminals (or control terminals, or voltage terminals), signals transmitted by the signal terminals, and signal lines coupled to the signal terminals are all represented by same symbols in the embodiments of the present disclosure, but their properties are different.

In some embodiments of the present disclosure, as shown in FIGS. 5 and 12A, the display apparatus 200 further includes at least one data signal transmission channel 211. For example, a multiplexer circuit is coupled to the source driver through a data transmission channel. For example, in a case where the multiplexer includes three multiplexer circuits, the multiplexer is coupled to the source driver through three data transmission channels.

It will be understood that a single output terminal of the source driver 210 is coupled to an input signal terminal IN of a single multiplexer circuit 10 through a single data transmission channel 211. Therefore, the number of output terminals of the source driver 210 is reduced, and the number of data transmission channels 211 coupled to the source driver 210 and the multiplexer circuits 10 is reduced.

For example, the source driver is bound to a base substrate of the display panel, and coupled to the multiplexer circuits.

It will be noted that, the multiplexer circuits may be integrated in the source driver, and have the same beneficial effects as the source driver, and details will not be repeated here.

In some embodiments, the display apparatus further includes an analog to digital converter (ADC). The ADC is coupled to the plurality of sensing lines, and is configured to sense signals from the sensing lines.

It will be understood that, within a preset time before an end of each sensing line sensing a threshold voltage of a driving transistor of a pixel circuit, the ADC samples the sensing line, so as to sense the threshold voltage of the driving transistor of the pixel circuit sensed by the sensing line. For example, referring to FIG. 15, within the preset time u before the end of each sensing line sensing the threshold voltage of the driving transistor of the pixel circuit, the ADC detects a voltage of a signal on the sensing line in response to a sensing control signal Spr_L (e.g., a high-voltage sensing control signal Spr_L). In this way, the ADC senses a threshold voltage of a driving transistor in a corresponding pixel circuit sensed by each sensing line, and compensates the threshold voltage to the corresponding pixel circuit through the source driver. It will be noted that, the preset time is a time for the ADC to sense the signal from each sensing line, and the duration of the preset time may be designed according to actual situations, which is not limited here.

In addition, in addition to sensing the threshold voltage of the driving transistor in a case where the display panel is turned off, the display apparatus may further sense a value of K of the driving transistor in real time during a blank phase (for example, $K=W/L \times Cox \times \times \mu$, where W/L is a width to length ratio of the driving transistor, Cox is a capacitance of a channel insulating layer, and p is a carrier mobility of a channel).

For example, the display apparatus may superimpose the sensed threshold voltage and the display data signal of the pixel circuit to obtain a superimposed data signal, and the superimposed signal is input into the pixel circuit. In a time of each frame, the pixel circuit internally compensates an actual threshold voltage of the driving transistor according to the superimposed data signal. In addition, the mobility of the driving transistor may be detected in the blank phase.

Embodiments of the present disclosure provide a driving method of a multiplexer circuit, and the multiplexer circuit is the multiplexer circuit in any of the above embodiments. For example, the multiplexer circuit includes the first selection sub-circuit and the second selection sub-circuit. The first selection sub-circuit is coupled to the first control terminal, the second control terminal, the input signal terminal, the power supply voltage terminal and the first output terminal. The second selection sub-circuit is coupled to the third control terminal, the fourth control terminal, the input signal terminal, the power supply voltage terminal and the second output terminal.

The driving method of the multiplexer circuit includes: transmitting, by the first selection sub-circuit, the input signal received at the input signal terminal to the first output terminal in response to the first control signal received at the first control terminal; transmitting, by the second selection sub-circuit, the voltage of the power supply voltage terminal to the second output terminal in response to the fourth control signal received at the fourth control terminal; transmitting, by the first selection sub-circuit, the voltage of the power supply voltage terminal to the first output terminal in response to the second control signal received at the second control terminal; and transmitting, by the second selection sub-circuit, the input signal received at the input signal terminal to the second output terminal in response to the third control signal received at the third control terminal.

It will be noted that, beneficial effects of the driving method of the multiplexer circuit are the same as the beneficial effects of the multiplexer circuit described above, which will not be repeated here.

Embodiments of the present disclosure provide a driving method of a multiplexer, and the multiplexer is the multiplexer in any of the embodiments described above. For example, the multiplexer includes a plurality of multiplexer circuits, each multiplexer circuit includes a first selection sub-circuit and a second selection sub-circuit. The first selection sub-circuit is coupled to a first control terminal, a second control terminal, an input signal terminal, a power supply voltage terminal and a first output terminal. The second selection sub-circuit is coupled to a third control terminal, a fourth control terminal, the input signal terminal, the power supply voltage terminal and a second output terminal. Input signal terminals, first output terminals and second output terminals of the plurality of multiplexer circuits are different.

The driving method of the multiplexer, includes:

transmitting, by the first selection sub-circuit in each multiplexer circuit, an input signal received at an input signal terminal coupled to the first selection sub-circuit in each multiplexer circuit to the first output terminal coupled to the first selection sub-circuit in each multiplexer circuit in response to a first control signal received at the first control terminal; transmitting, by the second selection sub-circuit in each multiplexer circuit, a voltage of the power supply voltage terminal to a second output terminal coupled to the second selection sub-circuit in each multiplexer circuit in response to a fourth control signal received at the fourth control terminal; and transmitting, by the first selection sub-circuit in each multiplexer circuit, the voltage of the supply voltage terminal to a first output terminal coupled to the first selection sub-circuit in each multiplexer circuit in response to the second control signal received at the second control terminal; and transmitting, by the second selection sub-circuit in each multiplexer circuit, the input signal received at the input signal terminal coupled to the second selection sub-circuit in each multiplexer circuit to the second output terminal coupled to the second selection sub-circuit in each multiplexer circuit in response to a third control signal received at the third control terminal.

It will be noted that, beneficial effects of the driving method of the multiplexer are the same as beneficial effects of the multiplexer described above, which will not be repeated here.

Embodiments of the present disclosure provide a driving method of a display apparatus, and the display apparatus is the display apparatus in any one of the embodiments described above. For example, each pixel in a display panel in the display apparatus includes a plurality of sub-pixels, each sub-pixel includes a pixel circuit, and the pixel circuit includes a driving transistor. The display panel further includes a plurality of sensing lines. Pixels coupled to a multiplexer in the display panel are coupled to a sensing line. For example, a pixel circuit in each sub-pixel in the pixels coupled to the multiplexer is coupled to the sensing line.

The driving method of the display apparatus includes as follows.

The source driver provides input signals for all multiplexer circuits in the multiplexer in the display panel.

The input signals received by the multiplexer circuits in the multiplexer are not identical. For example, one of the multiplexer circuits receives a high-voltage input signal (i.e., a high-level input signal), and the remaining multiplexer circuits receive low-voltage input signals (i.e., low-level input signals). In this case, a threshold voltage of a driving transistor of a pixel circuit in a sub-pixel in a pixel coupled to the multiplexer circuit receiving the high-voltage input signal may be sensed by the sensing line.

A first selection sub-circuit in a multiplexer circuit in the multiplexer transmits an input signal received at an input signal terminal coupled thereto to a first output terminal coupled thereto in response to the first control signal received at the first control terminal; and a second selection sub-circuit in the multiplexer circuit in the multiplexer transmits the voltage of the power supply voltage terminal to a second output terminal coupled thereto in response to the fourth control signal received at the fourth control terminal.

The sensing line senses a threshold voltage of a driving transistor of a pixel circuit in a sub-pixel in a pixel coupled to the first output terminal.

It will be noted that, a sensing line senses a threshold voltage of a driving transistor of a pixel circuit at a time. In this case, the sensing line senses the threshold voltages of the driving transistors in the pixel circuits coupled to the first output terminals of the multiple multiplexer circuits in the multiplexer at different times.

For example, the first output terminal of the multiplexer circuit in the multiplexer outputs a high-voltage signal, and first output terminals of remaining multiplexer circuits output low-voltage signals, so that the sensing line senses the threshold voltage of the driving transistor in the pixel circuit in the pixel coupled to the first output terminal of the multiplexer circuit. In this case, an output signal of the second output terminal of the multiplexer circuit and output signals of the first output terminals and second output terminals of the remaining multiplexer circuits are all low-voltage signals. In this way, it may avoid affecting the accuracy of the sensing line sensing the threshold voltage.

The first selection sub-circuit in the multiplexer circuit in the multiplexer transmits the voltage of the power supply voltage terminal to the first output terminal coupled thereto in response to the second control signal received at the second control terminal; and the second selection sub-circuit in the multiplexer circuit in the multiplexer transmits the input signal received at the input signal terminal coupled thereto to the second output terminal in response to the third control signal received at the third control terminal.

The sensing line senses a threshold voltage of a driving transistor of a pixel circuit in a sub-pixel in a pixel coupled to the second output terminal.

It will be understood that, the sensing line senses the threshold voltages of the driving transistors in the pixel circuits coupled to the second output terminals of the plurality multiplexer circuits in the multiplexer at different times.

For example, the second output terminal of the multiplexer circuit in the multiplexer outputs a high-voltage signal, and second output terminals of the remaining multiplexer circuits output low-voltage signals, so that the sensing line senses the threshold voltage of the driving transistor in the pixel circuit in the pixel coupled to the second output terminal of the multiplexer circuit. In this case, an output signal of the first output terminal of the multiplexer circuit and output signals of the first output terminals and the second output terminals of the remaining multiplexer circuits are all low-voltage signals. In this way, it may avoid affecting accuracy of the sensing line sensing the threshold voltage.

It will be noted that, beneficial effects of the driving method of the display apparatus are the same as beneficial effects of the display apparatus described above, which will not be repeated here.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A multiplexer circuit, comprising:
   a first selection sub-circuit coupled to a first control terminal, a second control terminal, an input signal terminal, a power supply voltage terminal and a first output terminal, wherein the first selection sub-circuit is configured to transmit an input signal received at the input signal terminal to the first output terminal in response to a first control signal received at the first control terminal, and transmit a voltage of the power supply voltage terminal to the first output terminal in response to a second control signal received at the second control terminal;
   a second selection sub-circuit coupled to a third control terminal, a fourth control terminal, the input signal terminal, the power supply voltage terminal and a second output terminal, wherein the second selection sub-circuit is configured to transmit the input signal received at the input signal terminal to the second output terminal in response to a third control signal received at the third control terminal, and transmit the voltage of the power supply voltage terminal to the second output terminal in response to a fourth control signal received at the fourth control terminal; and
   a first voltage control sub-circuit coupled to the power supply voltage terminal, the second control terminal and the first selection sub-circuit, wherein the first voltage control sub-circuit is configured to control a voltage of the second control signal received by the first selection sub-circuit at the second control terminal according to the voltage of the power supply voltage terminal and the second control signal received at the second control terminal.

2. The multiplexer circuit according claim 1, wherein the first selection sub-circuit includes:
   a first transistor, wherein a control electrode of the first transistor is coupled to the first control terminal, a first electrode of the first transistor is coupled to the input signal terminal, and a second electrode of the first transistor is coupled to the first output terminal; and
   a second transistor, wherein a control electrode of the second transistor is coupled to the second control terminal, a first electrode of the second transistor is coupled to the power supply voltage terminal, and a second electrode of the second transistor is coupled to the first output terminal.

3. The multiplexer circuit according claim 1, wherein the second selection sub-circuit includes:
   a third transistor, wherein a control electrode of the third transistor is coupled to the third control terminal, a first electrode of the third transistor is coupled to the input signal terminal, and a second electrode of the third transistor is coupled to the second output terminal; and
   a fourth transistor, wherein a control electrode of the fourth transistor is coupled to the fourth control terminal, a first electrode of the fourth transistor is coupled to the power supply voltage terminal, and a second electrode of the fourth transistor is coupled to the second output terminal.

4. The multiplexer circuit according to claim 1, wherein the first voltage control sub-circuit includes a first capacitor, wherein a first terminal of the first capacitor is coupled to the power supply voltage terminal, and a second terminal of the first capacitor is coupled to the second control terminal and the first selection sub-circuit.

5. The multiplexer circuit according to claim 1, further comprising: a second voltage control sub-circuit coupled to the power supply voltage terminal, the fourth control terminal and the second selection sub-circuit, wherein the second voltage control sub-circuit is configured to control a voltage of the fourth control signal received by the second selection sub-circuit at the fourth control terminal according to the voltage of the power supply voltage terminal and the fourth control signal received at the fourth control terminal.

6. The multiplexer circuit according to claim 5, wherein the second voltage control sub-circuit includes a second capacitor, wherein a first terminal of the second capacitor is coupled to the power supply voltage terminal, and a second terminal of the second capacitor is coupled to the fourth control terminal.

7. A multiplexer, comprising a plurality of multiplexer circuits according to claim 1, wherein input signal terminals of the plurality of multiplexer circuits are different, first output terminals of the plurality of multiplexer circuits are different, and second output terminals of the plurality of multiplexer circuits are different.

8. The multiplexer according to claim 7, wherein the number of the multiplexer circuits is three.

9. A display panel, comprising:
   a plurality of pixels; and
   at least one multiplexer according to claim 7, wherein each multiplexer is coupled to pixels in the plurality of pixels.

10. The display panel according to claim 9, wherein the plurality of pixels are arranged in an array;
    the multiplexer is coupled to two columns of pixels; and
    a first output terminal of each multiplexer circuit in the multiplexer is coupled to a column of pixels of the two columns of pixels, and a second output terminal of each multiplexer circuit in the multiplexer is coupled to another column of pixels of the two columns of pixels.

11. The display panel according to claim 10, wherein the two columns of pixels coupled to the multiplexer are adjacent.

12. The display panel according to claim 9, wherein each pixel includes a plurality of sub-pixels; and a first output terminal and a second output terminal of each multiplexer circuit in each multiplexer are respectively coupled to sub-pixels that emit light of a same color in different pixels.

13. The display panel according to claim 9, further comprising a plurality of sensing lines, wherein the pixels coupled to the multiplexer are coupled to a sensing line.

14. A display apparatus, comprising:
the display panel according to claim 11; and
a source driver, wherein the source driver is coupled to the at least one multiplexer in the display panel.

15. A driving method of a display apparatus according to claim 14, wherein each pixel in the display panel in the display apparatus includes a plurality of sub-pixels, each sub-pixel includes a pixel circuit, the pixel circuit includes a driving transistor, the display panel further includes a plurality of sensing lines, and the pixels coupled to the multiplexer in the display panel are coupled to a sensing line; the driving method comprising:
providing, by the source driver, input signals to all multiplexer circuits in the multiplexer in the display panel;
transmitting, by a first selection sub-circuit in a multiplexer circuit in the multiplexer, an input signal received at an input signal terminal coupled to the first selection sub-circuit in the multiplexer circuit in the multiplexer to a first output terminal coupled to the first selection sub-circuit in the multiplexer circuit in the multiplexer in response to the first control signal received at the first control terminal;
transmitting, by a second selection sub-circuit in the multiplexer circuit in the multiplexer, the voltage of the power supply voltage terminal to a second output terminal coupled to the second selection sub-circuit in the multiplexer circuit in the multiplexer in response to the fourth control signal received at the fourth control terminal;
sensing, by the sensing line, a threshold voltage of a driving transistor of a pixel circuit in a sub-pixel in a pixel coupled to the first output terminal;
transmitting, by the first selection sub-circuit in the multiplexer circuit in the multiplexer, the voltage of the power supply voltage terminal to the first output terminal coupled to the first selection sub-circuit in the multiplexer circuit in the multiplexer in response to the second control signal received at the second control terminal;
transmitting, by the second selection sub-circuit in the multiplexer circuit in the multiplexer, the input signal received at the input signal terminal coupled to the second selection sub-circuit in the multiplexer circuit in the multiplexer to the second output terminal coupled to the second selection sub-circuit in the multiplexer circuit in the multiplexer in response to the third control signal received at the third control terminal;
sensing, by the sensing line, a threshold voltage of a driving transistor of a pixel circuit in a sub-pixel in a pixel coupled to the second output terminal; and
controlling, by a first voltage control sub-circuit in the multiplexer circuit in the multiplexer, a voltage of the second control signal received by the first selection sub-circuit at the second control terminal according to the voltage of the power supply voltage terminal and the second control signal received at the second control terminal.

16. A driving method of the multiplexer circuit according to claim 1, the driving method comprising:
transmitting, by the first selection sub-circuit, the input signal received at the input signal terminal to the first output terminal in response to the first control signal received at the first control terminal;
transmitting, by the second selection sub-circuit, the voltage of the power supply voltage terminal to the second output terminal in response to the fourth control signal received at the fourth control terminal;
transmitting, by the first selection sub-circuit, the voltage of the power supply voltage terminal to the first output terminal in response to the second control signal received at the second control terminal;
transmitting, by the second selection sub-circuit, the input signal received at the input signal terminal to the second output terminal in response to the third control signal received at the third control terminal; and
controlling, by the first voltage control sub-circuit, the voltage of the second control signal received by the first selection sub-circuit at the second control terminal according to the voltage of the power supply voltage terminal and the second control signal received at the second control terminal.

17. A multiplexer circuit, comprising:
a first transistor, wherein a control electrode of the first transistor is coupled to a first control terminal, a first electrode of the first transistor is coupled to an input signal terminal, and a second electrode of the first transistor is coupled to a first output terminal;
a second transistor, wherein a control electrode of the second transistor is coupled to a second control terminal, a first electrode of the second transistor is coupled to a power supply voltage terminal, and a second electrode of the second transistor is coupled to the first output terminal;
a third transistor, wherein a control electrode of the third transistor is coupled to a third control terminal, a first electrode of the third transistor is coupled to the input signal terminal, and a second electrode of the third transistor is coupled to a second output terminal;
a fourth transistor, wherein a control electrode of the fourth transistor is coupled to a fourth control terminal, a first electrode of the fourth transistor is coupled to the power supply voltage terminal, and a second electrode of the fourth transistor is coupled to the second output terminal; and
a first capacitor, wherein a first terminal of the first capacitor is coupled to the power supply voltage terminal, and a second terminal of the first capacitor is coupled to the second control terminal and the control electrode of the second transistor.

18. A driving method of a multiplexer, wherein the multiplexer includes a plurality of multiplexer circuits, each multiplexer circuit includes a first selection sub-circuit a second selection sub-circuit and a first voltage control sub-circuit, the first selection sub-circuit is coupled to a first control terminal, a second control terminal, an input signal terminal, a power supply voltage terminal and a first output terminal, the second selection sub-circuit is coupled to a third control terminal, a fourth control terminal, the input signal terminal, the power supply voltage terminal and a second output terminal, the first voltage control sub-circuit is coupled to the power supply voltage terminal, the second control terminal and the first selection sub-circuit, input signal terminals of the plurality of multiplexer circuits are different, first output terminals of the plurality of multiplexer circuits are different, and second output terminals of the plurality of multiplexer circuits are different; the driving method comprising:
- transmitting, by the first selection sub-circuit in each multiplexer circuit, an input signal received at the input signal terminal coupled to the first selection sub-circuit in each multiplexer circuit to the first output terminal coupled to the first selection sub-circuit in each multiplexer circuit in response to a first control signal received at the first control terminal;
- transmitting, by the second selection sub-circuit in each multiplexer circuit, a voltage of the power supply voltage terminal to the second output terminal coupled to the second selection sub-circuit in each multiplexer circuit in response to a fourth control signal received at the fourth control terminal;
- transmitting, by the first selection sub-circuit in each multiplexer circuit, the voltage of the power supply voltage terminal to the first output terminal coupled to the first selection sub-circuit in each multiplexer circuit in response to a second control signal received at the second control terminal;
- transmitting, by the second selection sub-circuit in each multiplexer circuit, the input signal received at the input signal terminal coupled to the second selection sub-circuit in each multiplexer circuit to the second output terminal in response to a third control signal received at the third control terminal; and
- controlling, by the first voltage control sub-circuit in each multiplexer circuit, a voltage of the second control signal received by the first selection sub-circuit at the second control terminal according to the voltage of the power supply voltage terminal and the second control signal received at the second control terminal.

* * * * *

UNITED STATES PATENT AND TRADEMARK OFFICE
CERTIFICATE OF CORRECTION

PATENT NO. : 11,769,445 B2
APPLICATION NO. : 17/793536
DATED : September 26, 2023
INVENTOR(S) : Can Yuan, Yongqian Li and Zhidong Yuan It is certified that error appears in the above-identified patent and that said Letters Patent is hereby corrected as shown below:

In the Claims

In Column 39, Line 10, please change "claim 11" to --claim 9--.

Signed and Sealed this
Second Day of January, 2024

Katherine Kelly Vidal
*Director of the United States Patent and Trademark Office*